(12) United States Patent
Toyoda et al.

(10) Patent No.: US 11,057,135 B2
(45) Date of Patent: Jul. 6, 2021

(54) TRANSMITTER, RECEIVER, AND CLOCK TRANSFER METHOD

(71) Applicant: FUJITSU LIMITED, Kawasaki (JP)

(72) Inventors: Hitomi Toyoda, Fukuoka (JP); Eiji Gobaru, Fukuoka (JP); Haruhisa Fukano, Munakata (JP); Takuya Nishioka, Fukuoka (JP); Atsunori Machida, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 16/268,223

(22) Filed: Feb. 5, 2019

(65) Prior Publication Data

US 2019/0245637 A1 Aug. 8, 2019

(30) Foreign Application Priority Data

Feb. 8, 2018 (JP) .............................. JP2018-021092

(51) Int. Cl.
*H04J 3/06* (2006.01)
*H04L 7/00* (2006.01)
*H04L 7/04* (2006.01)

(52) U.S. Cl.
CPC .......... *H04J 3/0635* (2013.01); *H04L 7/0008* (2013.01); *H04L 7/04* (2013.01)

(58) Field of Classification Search
CPC ........ H04J 3/0635; H04J 3/047; H04J 3/0605; H04J 3/0685; H04L 7/0008; H04L 7/04; H03M 9/00
USPC ................................................. 370/503, 535
See application file for complete search history.

(56) References Cited

U.S. PATENT DOCUMENTS

| | | | |
|---|---|---|---|
| 2003/0179783 A1* | 9/2003 | Uekama | H04J 3/1611 370/535 |
| 2004/0218902 A1* | 11/2004 | Yanagita | G11B 27/28 386/248 |
| 2008/0094117 A1* | 4/2008 | Stoler | H03K 5/135 327/162 |
| 2018/0335979 A1* | 11/2018 | Kim | G06F 11/1068 |

FOREIGN PATENT DOCUMENTS

| | | |
|---|---|---|
| JP | 08-256125 | 10/1996 |
| JP | 2010-147990 | 7/2010 |
| JP | 2013-062668 | 4/2013 |
| JP | 2015-046749 | 3/2015 |

* cited by examiner

*Primary Examiner* — Kwang B Yao
*Assistant Examiner* — Syed M Bokhari
(74) *Attorney, Agent, or Firm* — Fujitsu Patent Center

(57) ABSTRACT

A transmitter includes a memory, and a processor configured to generate a first clock parallel signal by performing serial-parallel conversion of a first clock signal acquired by using a reference clock and generate a second clock parallel signal by performing serial-parallel conversion of a second clock signal acquired by using the reference clock, generate first compressed information by compressing the first clock parallel signal on the basis of clock periodicity and generate second compressed information by compressing the second clock parallel signal based on the clock periodicity, generate a serial signal by adding a synchronization signal indicating a top of a multiplexed signal to the multiplexed signal generated by time-division multiplexing of the first compressed information and the second compressed information, and transmit the serial signal to a receiver.

7 Claims, 20 Drawing Sheets

TRANSMITTER, RECEIVER, AND CLOCK TRANSFER METHOD

CROSS-REFERENCE TO RELATED APPLICATION

This application is based upon and claims the benefit of priority of the prior Japanese Patent Application No. 2018-21092, filed on Feb. 8, 2018, the entire contents of which are incorporated herein by reference.

FIELD

The embodiments discussed herein are related to a technique of clock transfer.

BACKGROUND

In recent years, the performance of electronic components, such as bipolar transistors and field-effect transistors, is improved, and the development of semiconductor devices, such as large scale integration circuit (LSI) and application specific integrated circuit (ASIC), is significantly progressed.

In the operation of the semiconductor devices, a transmitter and a receiver communicate and synchronize with each other in many cases. In this case, a clock signal as a timing signal for synchronization is transferred in addition to data and a control signal.

An example of the related technique proposed includes a technique in which a multiplexed clock signal including a plurality of types of clock signals with different periods is generated based on a reference clock signal, and the reference clock signal and the multiplexed clock signal are distributed to a module.

For example, related art is disclosed in Japanese Laid-open Patent Publication No. 2010-147990.

SUMMARY

According to an aspect of the embodiments, a transmitter includes a memory, and a processor configured to generate a first clock parallel signal by performing serial-parallel conversion of a first clock signal acquired by using a reference clock and generate a second clock parallel signal by performing serial-parallel conversion of a second clock signal acquired by using the reference clock, generate first compressed information by compressing the first clock parallel signal on the basis of clock periodicity and generate second compressed information by compressing the second clock parallel signal based on the clock periodicity, generate a serial signal by adding a synchronization signal indicating a top of a multiplexed signal to the multiplexed signal generated by time-division multiplexing of the first compressed information and the second compressed information, and transmit the serial signal to a receiver.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A clock parallel transmission system is widely used in a communication interface, and in the system, a reference clock signal is transmitted in parallel with data or a control signal transferred to the opposite side. In the clock parallel transmission system, the frequency of the parallel transmission clock is increased with an increase in the data operation speed.

In the related technique, speeding up the reference clock signal and transmitting the reference clock signal in parallel reduce the signal integrity or significantly affect the setup time or the hold time. This causes a malfunction or degrades the performance of a semiconductor device.

Embodiments will now be described with reference to the drawings.

First Embodiment

Figure 1:
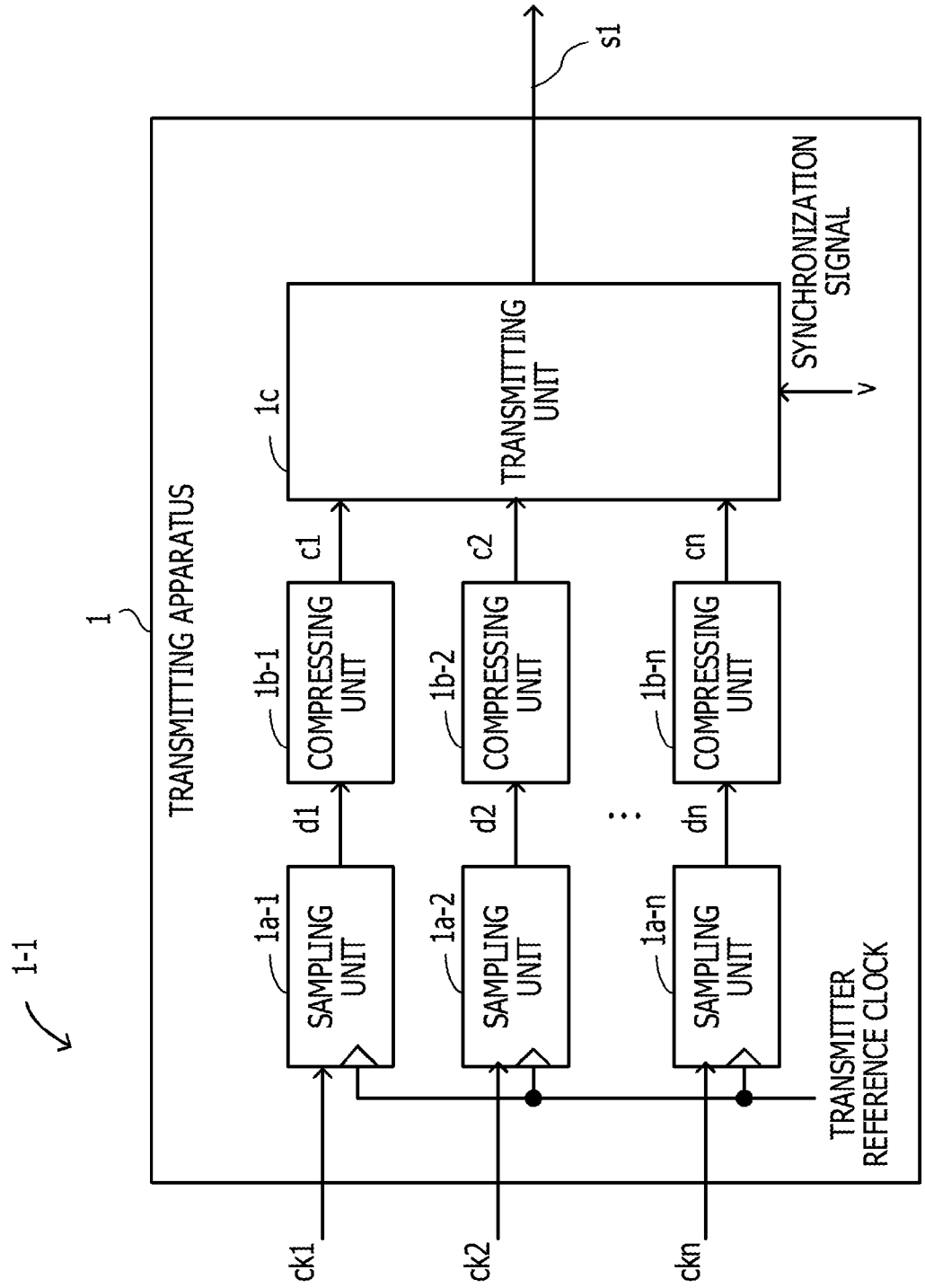
FIG. 1 depicts an example of configuration of a transmitter of a clock transfer system.
Figure 2:
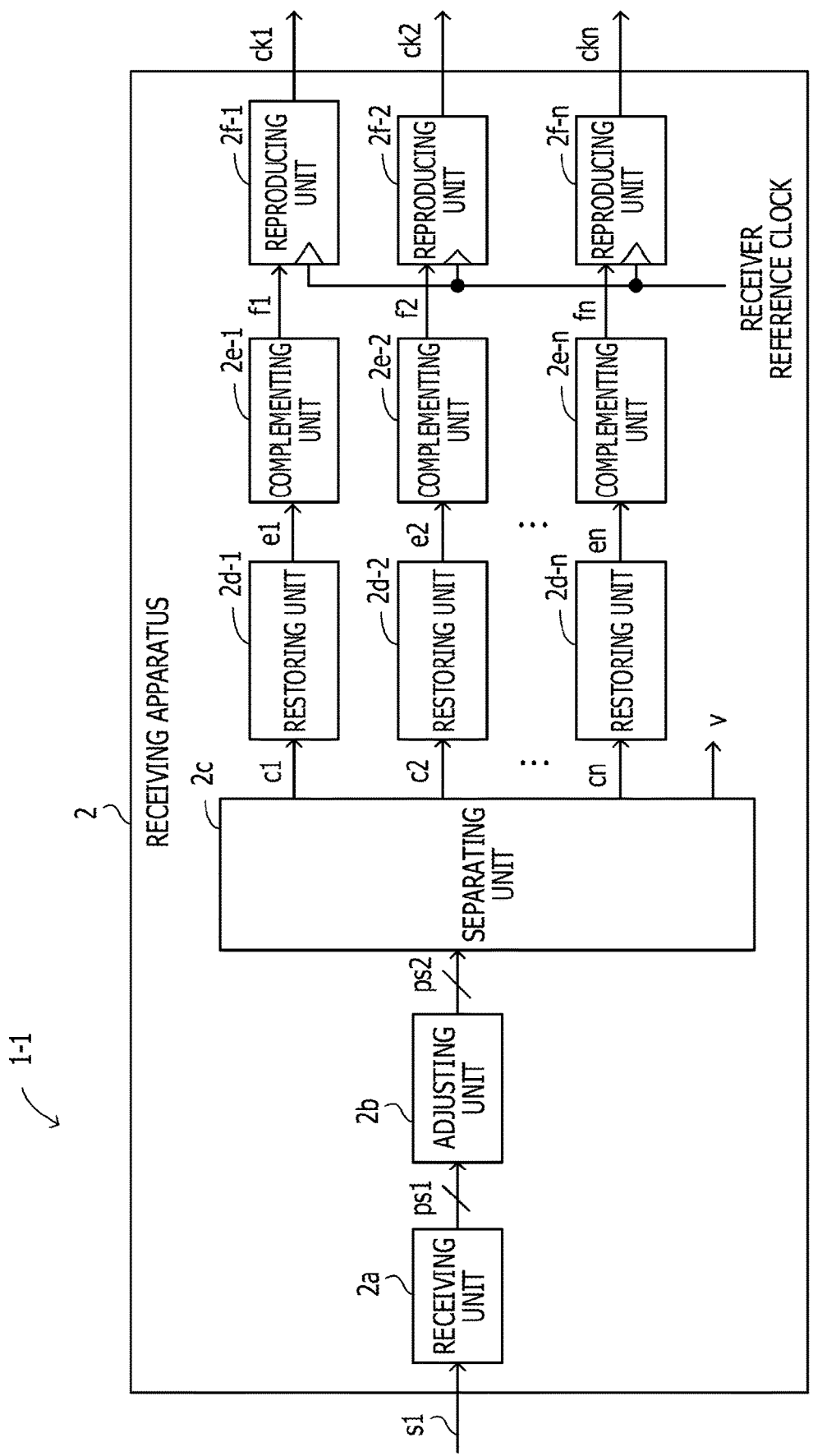
FIG. 2 depicts an example of configuration of a receiver of a clock transfer system.

A first embodiment will be described with reference to FIG. 1. FIGS. 1 and 2 depict an example of configuration of a clock transfer system.

A clock transfer system 1-1 includes a transmitter 1 and a receiver 2 and transfers a clock from the transmitter 1 to the receiver 2. The clock transfer system 1-1 is, for example, applied to transfer a clock between modules in a semiconductor device or to transfer a clock between circuit boards.

The transmitter 1 includes sampling units 1a-1, 1a-2, . . . , 1a-n, compressing units 1b-1, 1b-2, . . . , 1b-n, and a transmitting unit 1c.

The sampling units 1a-1, 1a-2, ..., 1a-n use a transmitter reference clock to sample clock signals ck1, ck2, ..., ckn and perform serial-parallel conversion to generate clock parallel signals d1, d2, ..., dn.

The compressing units 1b-1, 1b-2, ..., 1b-n compress the clock parallel signals d1, d2, ..., dn based on clock periodicity and generate compressed information c1, c2, ..., cn.

The transmitting unit 1c performs time-division multiplexing of at least the compressed information c1, c2, ..., cn and a synchronization signal v indicating the top of time slots of the clock signals ck1, ck2, ..., ckn to generate a clock-multiplexed serial signal s1 and transmits the serial signal s1 to the receiver 2.

The receiver 2 includes a receiving unit 2a, an adjusting unit 2b (alignment adjusting unit), a separating unit 2c, restoring units 2d-1, 2d-2, ..., 2d-n, complementing units 2e-1, 2e-2, ..., 2e-n, and reproducing units 2f-1, 2f-2, ..., 2f-n.

The receiving unit 2a receives the serial signal s1 and performs serial-parallel conversion of the serial signal s1 to generate a clock parallel signal ps1. The alignment adjusting unit 2b adjusts alignment (controls synchronization) of the clock parallel signal ps1 based on the synchronization signal v.

The separating unit 2c separates at least the synchronization signal v and the compressed information c1, c2, ..., cn from a clock parallel signal ps2 after the adjustment of alignment.

The restoring units 2d-1, 2d-2, ..., 2d-n restore fragmentary clock waveform data e1, e2, ..., en based on the compressed information c1, c2, ..., cn.

The complementing units 2e-1, 2e-2, ..., 2e-n complement waveforms of the clock waveform data e1, e2, ..., en to generate clock parallel complement signals f1, f2, ..., fn. The reproducing units 2f-1, 2f-2, ..., 2f-n perform parallel-serial conversion of the clock parallel complement signals f1, f2, ..., fn based on a receiver reference clock to shape waveforms and reproduce the clock signals ck1, ck2, ..., ckn.

In this way, the transmitter 1 in the clock transfer system 1-1 converts a plurality of clock signals into clock parallel signals and compresses the clock parallel signals based on the clock periodicity to generate compressed information. The transmitter 1 then performs serial transfer of the superimposed signal of the synchronization signal and the compressed information. When the receiver 2 receives the superimposed signal, the receiver 2 restores, complements, and reproduces the clock signals based on the compressed information.

In this way, the clock transfer system 1-1 compresses and superimposes clock signals at a high-rate frequency. As a result, the clock signals may be transferred between apparatuses at a lower bit rate, or more clock signals may be superimposed. This may improve the transfer efficiency of the clock signals. In addition, the parallel transmission of the reference clock may not be performed.

Second Embodiment

Figure 3:
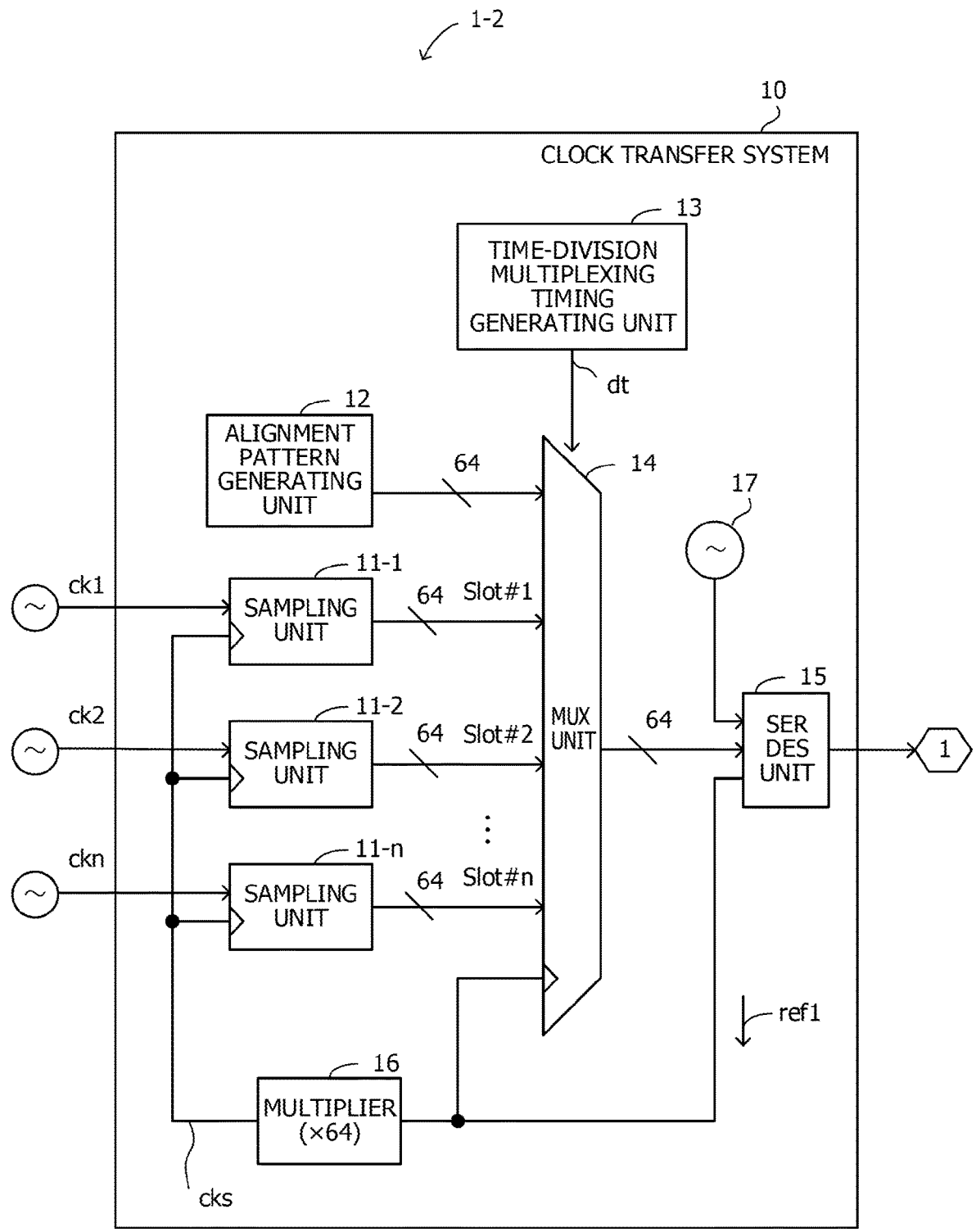
FIG. 3 depicts an example of configuration of a transmitting unit of a clock transfer system.
Figure 4:
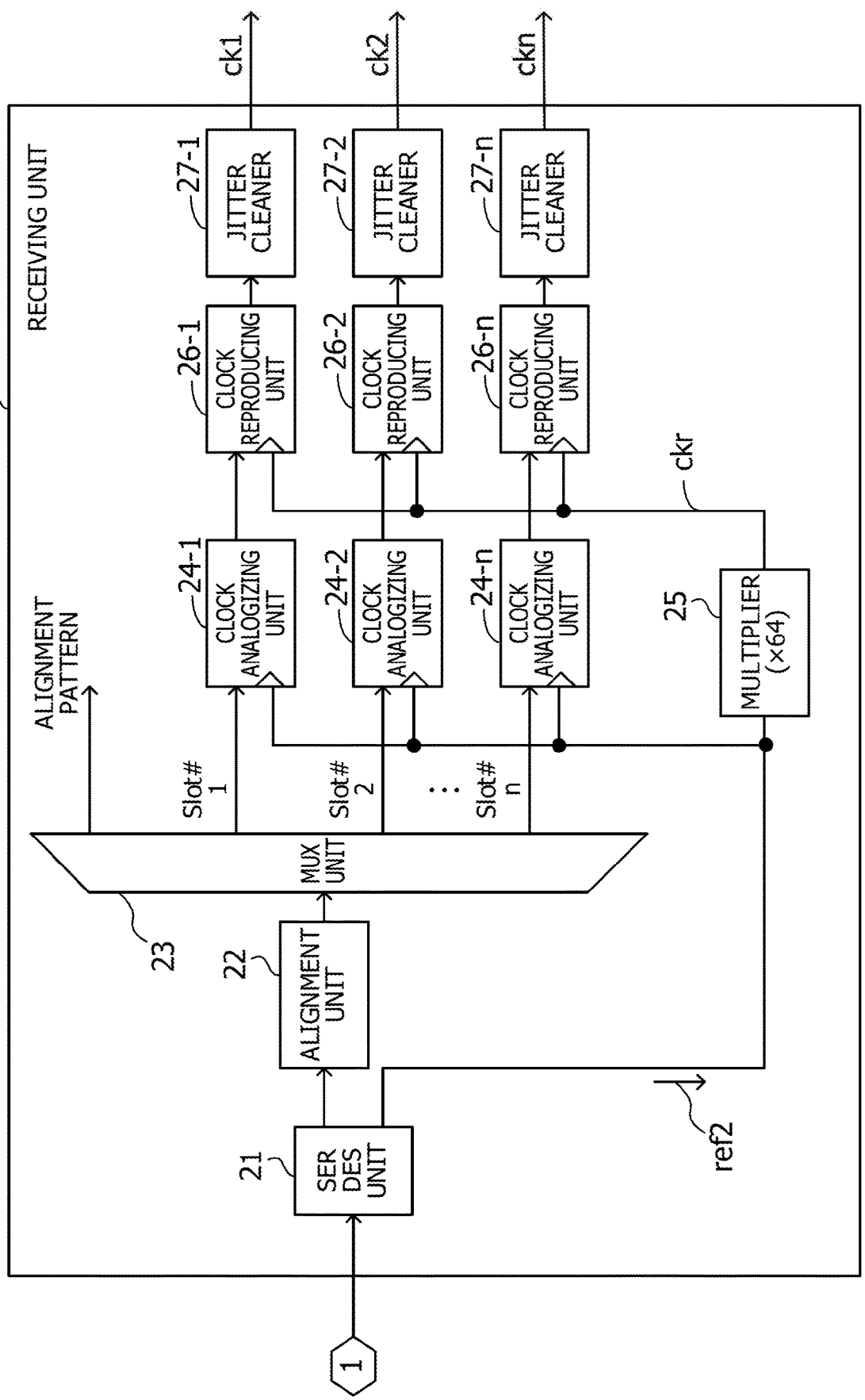
FIG. 4 depicts an example of configuration of a receiving unit of a clock transfer system.

Next, a second embodiment will be described. FIGS. 3 and 4 depict an example of configuration of a clock transfer system. A clock transfer system 1-2 includes a transmitting unit 10 and a receiving unit 20.

The transmitting unit 10 of FIG. 3 includes sampling units 11-1, 11-2, ..., 11-n, an alignment pattern generating unit 12, a time-division multiplexing timing generating unit 13, a multiplexing (MUX) unit 14, a serializer/deserializer (SERDES) unit 15, a multiplier 16, and an oscillator 17.

The transmitting unit 10 of FIG. 3 converts the plurality of clock signals ck1, ck2, ..., ckn into parallel data and superimposes the parallel data based on a timing signal of time-division multiplexing. In this case, the transmitting unit 10 outputs the superimposed data after inserting an alignment pattern to allow the receiver to distinguish the top of the time slot (hereinafter, simply referred to as slot in some cases).

The superimposed data is time-division-multiplexed in 64 bits, and each of the clock signals ck1, ..., ckn is superimposed in each slot. Each constituent element will now be described.

The sampling units 11-1, 11-2, ..., 11-n receive the plurality of clock signals ck1, ck2, ..., ckn and a clock cks (transmitter reference clock in FIG. 1) output from the multiplier 16.

The sampling units 11-1, 11-2, ..., 11-n sample the plurality of clock signals ck1, ck2, ..., ckn based on the clock cks and convert the plurality of clock signals ck1, ck2, ..., ckn into clock parallel data (clock parallel signal).

The sampling units 11-1, 11-2, ..., 11-n then output the clock parallel data to the MUX unit 14 for #slots 1, #2, ..., #n, respectively. In the example, clock parallel data of 64 bits is output from one sampling unit.

The alignment pattern generating unit 12 generates an alignment pattern for causing an alignment unit 22 described later of the receiving unit 20 to execute pattern matching. The alignment pattern is used as a marker that plays a role of a synchronization signal for marking the clock in given lengths.

The time-division multiplexing timing generating unit 13 generates a timing signal dt to be used for the time-division multiplexing by the MUX unit 14 and outputs the timing signal dt.

The MUX unit 14 receives the alignment pattern output by the alignment pattern generating unit 12 and the clock parallel data output by the sampling units 11-1, 11-2, ..., 11-n.

In accordance with the timing signal dt output by the time-division multiplexing timing generating unit 13, the MUX unit 14 uses a reference clock ref1 output from the SERDES unit 15 to perform time-division multiplexing of the alignment pattern and the clock parallel data to generate superimposed data. In the example, parallel superimposed data of 64 bits is output from the MUX unit 14.

The SERDES unit 15 generates the reference clock ref1 for serial transfer of the parallel signal based on a clock oscillated by the oscillator 17 and transmits the reference clock ref1 to the multiplier 16 and the MUX unit 14.

The SERDES unit 15 also uses the generated reference clock refs to perform parallel-serial conversion of the superimposed data output by the MUX unit 14 (functions as a serializer) and transmits the converted serial data (serial signal s1 in FIG. 1) to the receiving unit 20.

The multiplier 16 multiplies the reference clock ref1 by N (multiplied by 64 in the example) to generate the clock cks and outputs the cks to the sampling units 11-1, 11-2, ..., 11-n.

The receiving unit 20 of FIG. 4 includes a SERDES unit 21, the alignment unit 22, a demultiplexing (DMUX) (separating) unit 23, clock analogizing units 24-1, 24-2, ..., 24-n, a multiplier 25, clock reproducing units 26-1, 26-2, ..., 26-n, and jitter cleaners 27-1, 27-2, ..., 27-n.

The receiving unit 20 reproduces the clock signals from the serial data multiplexed with the clock signals transmitted from the transmitting unit 10. Each constituent element will now be described.

The SERDES unit 21 generates a reference clock ref2 and transmits the reference clock ref2 to the clock analogizing units 24-1, 24-2, . . . , 24-n and the multiplier 25.

Once the SERDES unit 21 receives the serial data output from the transmitting unit 10, the SERDES unit 21 performs parallel conversion of the serial data (functions as a deserializer) and outputs the parallel data.

The alignment unit 22 compares the alignment pattern provided to the parallel data with an alignment pattern set in advance to detect a word boundary and performs word alignment.

From the top time slot recognized in the word alignment, the DMUX unit 23 separates the clock data into each slot.

The clock analogizing units 24-1, 24-2, . . . , 24-n use the reference clock ref2 to analogize and complement the clock waveform based on the fragmentary data of the restoration clocks. For example, the clock data output from the DMUX unit 23 is partially missing, and therefore, the waveform of the missed part is analogized to complement the clock data in the clock analogizing process.

For example, the clock analogizing units 24-1, 24-2, . . . , 24-n specify a period pattern from the parallel data of each of the slots #1, #2, . . . , #n received from the DMUX unit 23. The clock analogizing units 24-1, 24-2, . . . , 24-n then repeat a specific action of the period pattern to analogize and complement the clock waveform of the period not including clock data (partially missing period).

The multiplier 25 multiplies the reference clock ref2 by N (multiplied by 64 in the example) to generate a clock ckr (receiver reference clock in FIG. 2) and outputs the clock ckr to the clock reproducing units 26-1, 26-2, . . . , 26-n.

The clock reproducing units 26-1, 26-2, . . . , 26-n reproduce the clocks from the analogized clock data based on the clock ckr and convert the reproduced clocks into serial data. The jitter cleaners 27-1, 27-2, . . . , 27-n remove the jitter (or wander) of the serial data and shape the waveforms.

<Clock Superimposition Process>

Figure 5:
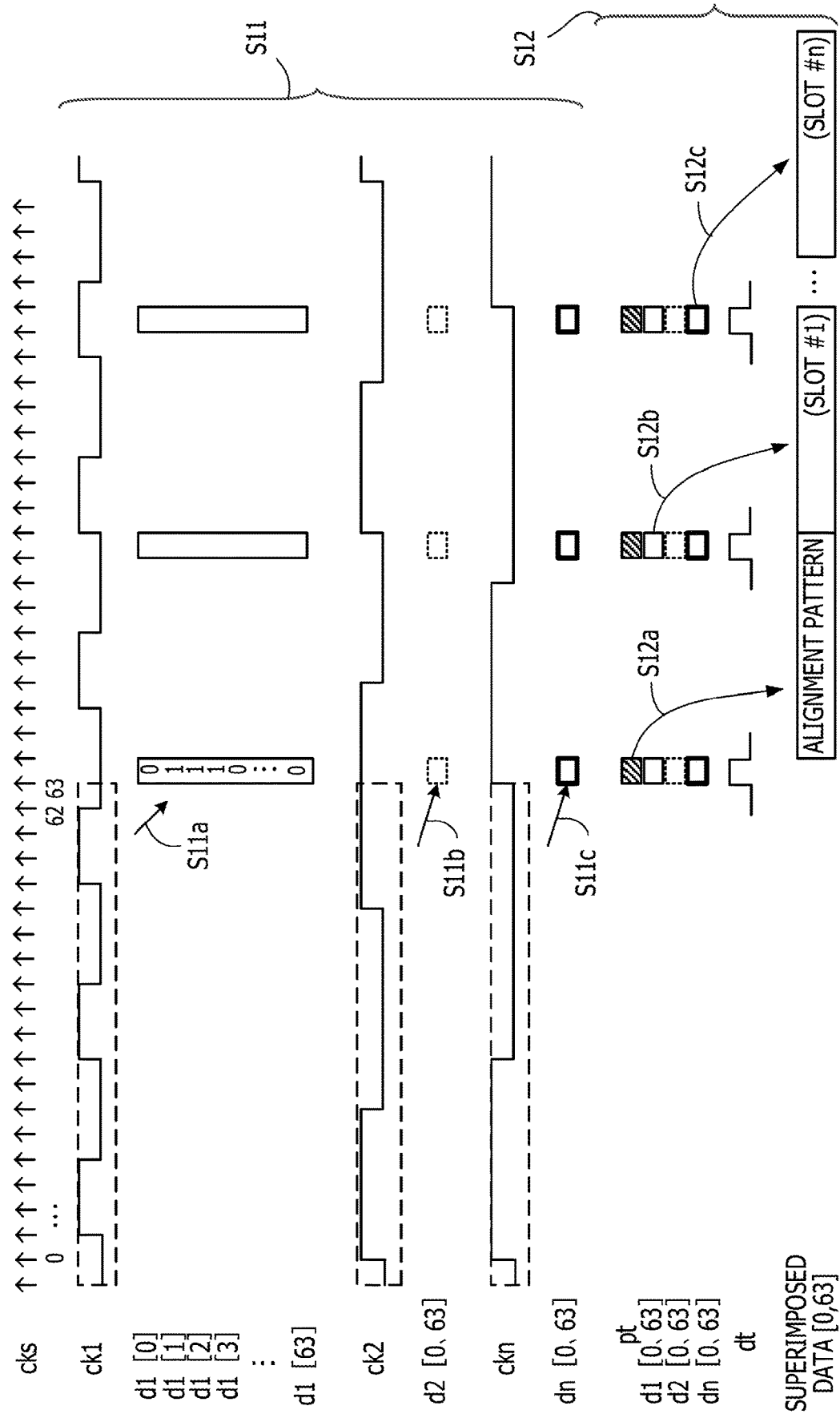
FIG. 5 is a time chart for describing an operation of a transmitting unit.

FIG. 5 is a time chart for describing an operation of a transmitting unit.

[Step S11] The sampling units 11-1, 11-2, . . . , 11-n use the high-speed clock cks to sample the plurality of clock signals ck1, ck2, . . . , ckn and perform serial-parallel conversion.

[Step S11a] The sampling unit 11-1 converts the clock signal ck1 into clock parallel data d1[0], . . . , d1[63] of 64 bits (hereinafter, [0], . . . , [63] may be written as [0,63]).

[Step S11b] The sampling unit 11-2 converts the clock signal ck2 into clock parallel data d2[0,63] of 64 bits.

[Step S11c] The sampling unit 11-n converts the clock signal ckn into clock parallel data dn[0,63] of 64 bits.

[Step S12] The MUX unit 14 performs time-division multiplexing of the alignment pattern and the clock parallel data according to the timing signal dt generated by the time-division multiplexing timing generating unit 13 and generates parallel superimposed data of 64 bits.

[Step S12a] An alignment pattern pt is inserted at the top of the superimposed data [0,63].

[Step S12b] The clock parallel data d1[0,63] is inserted into the slot #1 of the superimposed data [0,63].

[Step S12c] The clock parallel data dn[0,63] is inserted into the slot #n of the superimposed data [0,63].

<Clock Reproducing Process>

Figure 6:
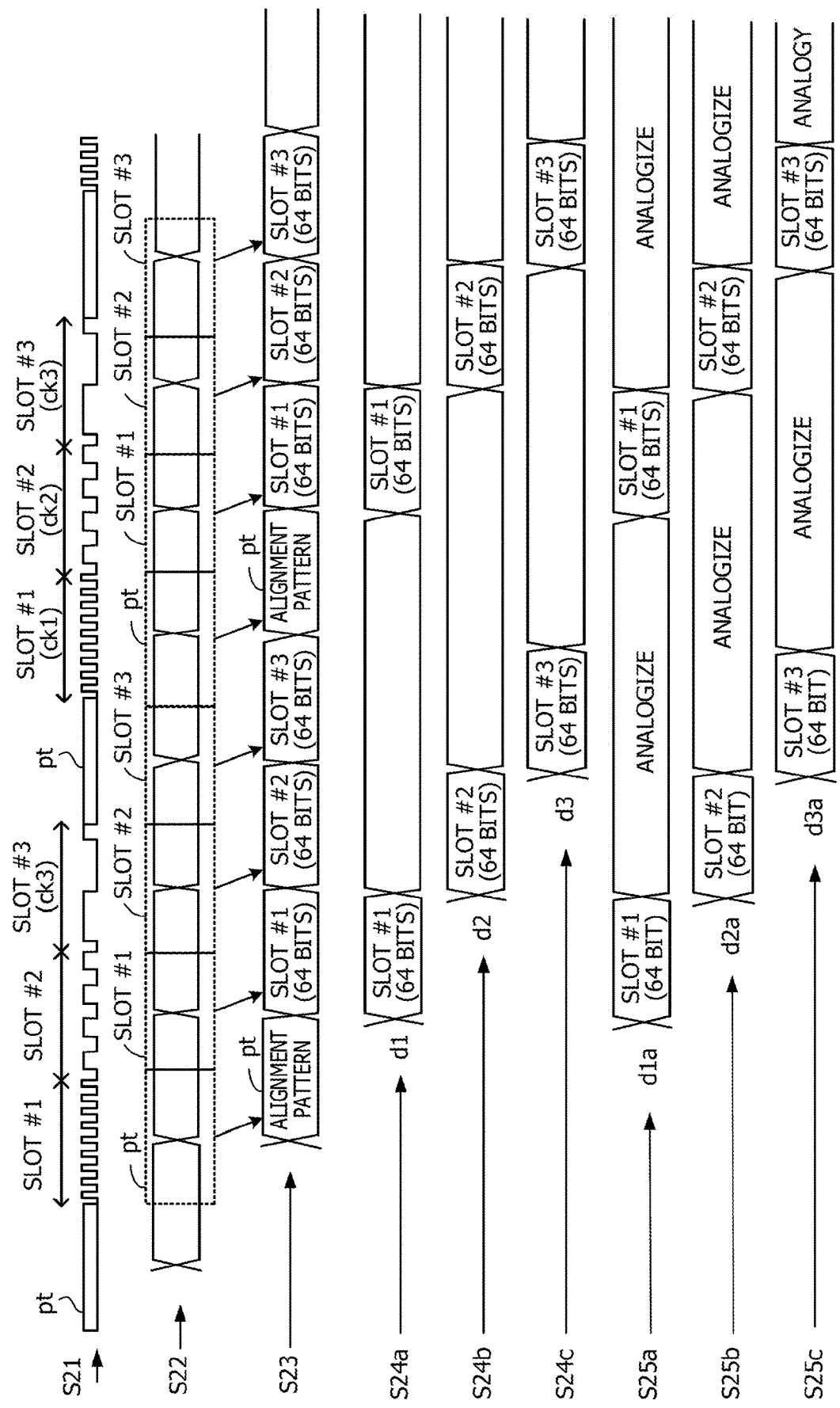
FIG. 6 is a time chart for describing an operation of a receiving unit.
Figure 7:
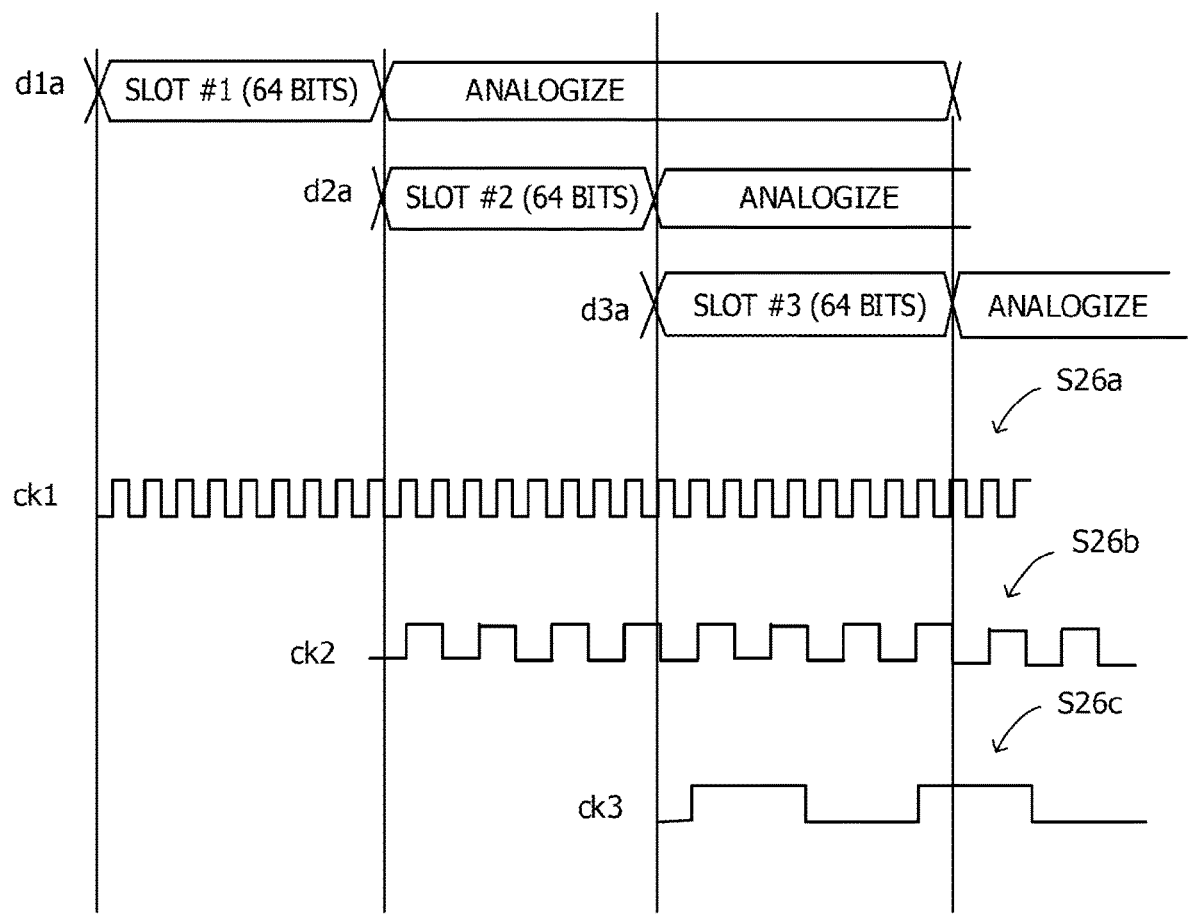
FIG. 7 is a time chart for describing an operation of a receiving unit.

FIGS. 6 and 7 are time charts for describing an operation of a receiving unit.

[Step S21] It is assumed that the SERDES unit 21 receives serial data in which the alignment pattern pt is multiplexed at the top of the data, the clock signal ck1 is multiplexed in the slot #1, the clock signal ck2 is multiplexed in the slot #2, and the clock signal ck3 is multiplexed in the slot #3.

[Step S22] The SERDES unit 21 converts the serial data into parallel data.

[Step S23] The alignment unit 22 includes an alignment pattern of the alignment unit 22. The alignment unit 22 compares the alignment pattern with the alignment pattern pt provided to the signal converted into the parallel data by the SERDES unit 21. The alignment unit 22 detects a word boundary and performs word alignment.

[Step S24a] The DMUX unit 23 outputs the clock parallel data d1 from the slot #1.

[Step S24b] The DMUX unit 23 outputs the clock parallel data d2 from the slot #2.

[Step S24c] The DMUX unit 23 outputs the clock parallel data d3 from the slot #3.

[Step S25a] The clock analogizing unit 24-1 receives the clock parallel data d1 of the slot #1 to analogize the clock and complement the waveform and outputs clock parallel data d1a.

[Step S25b] The clock analogizing unit 24-2 receives the clock parallel data d2 of the slot #2 to analogize the clock and complement the waveform and outputs clock parallel data d2a.

[Step S25c] The clock analogizing unit 24-3 receives the clock parallel data d3 of the slot #3 to analogize the clock and complement the waveform and outputs clock parallel data d3a.

[Step S26a] The clock reproducing unit 26-1 reproduces the serial clock signal ck1 from the clock parallel data d1a of the slot #1.

[Step S26b] The clock reproducing unit 26-2 reproduces the serial clock signal ck2 from the clock parallel data d2a of the slot #2.

[Step S26c] The clock reproducing unit 26-3 reproduces the serial clock signal ck3 from the clock parallel data d3a of the slot #3.

<Clock Transfer System with Compression Function of Superimposed Data>

Next, a compression process of the superimposed data will be described. The data may be compressed in the clock superimposition process to significantly reduce the power consumption or improve the transmission efficiency.

Figure 8:
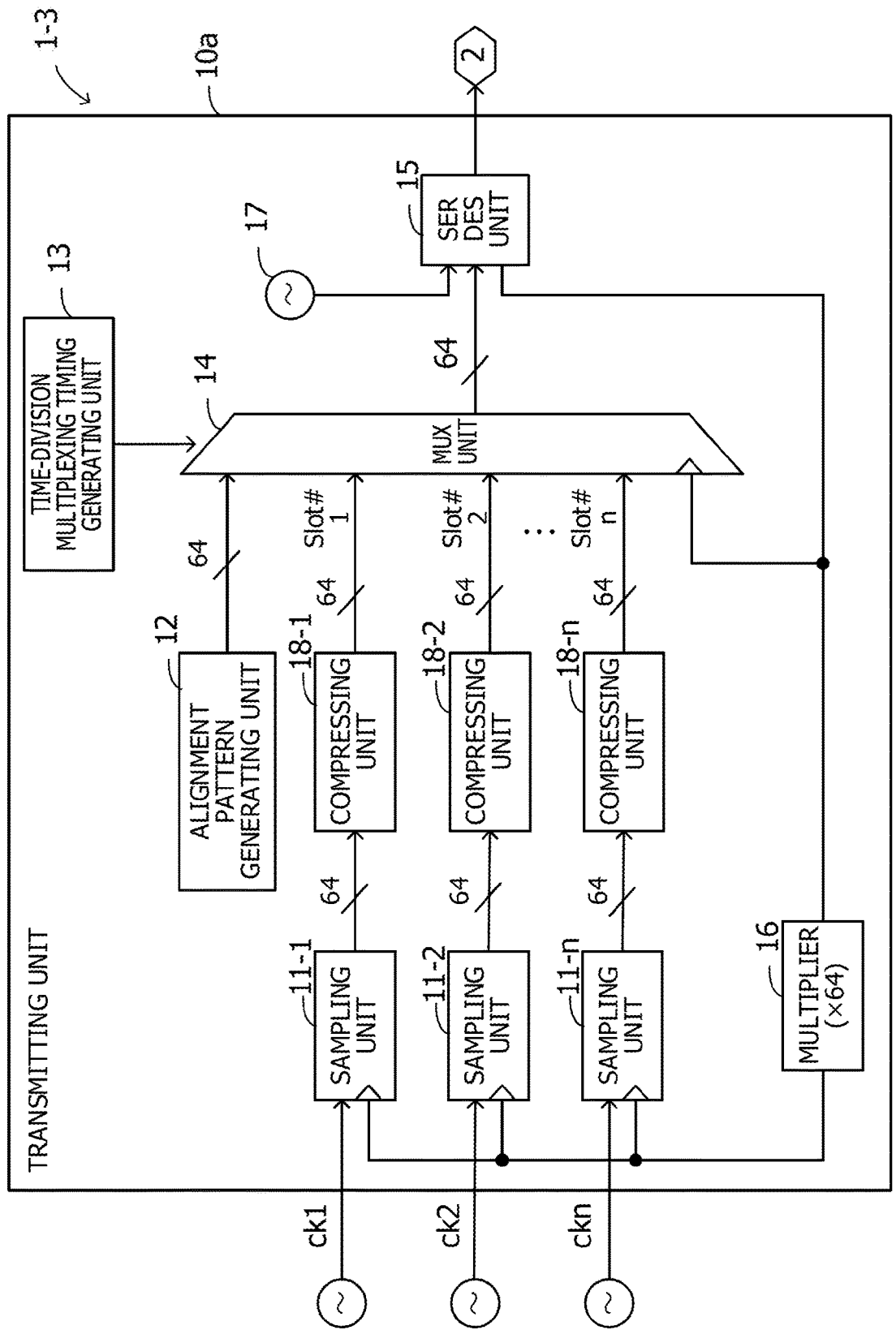
FIG. 8 depicts an example of configuration of a transmitting unit of a clock transfer system.
Figure 9:
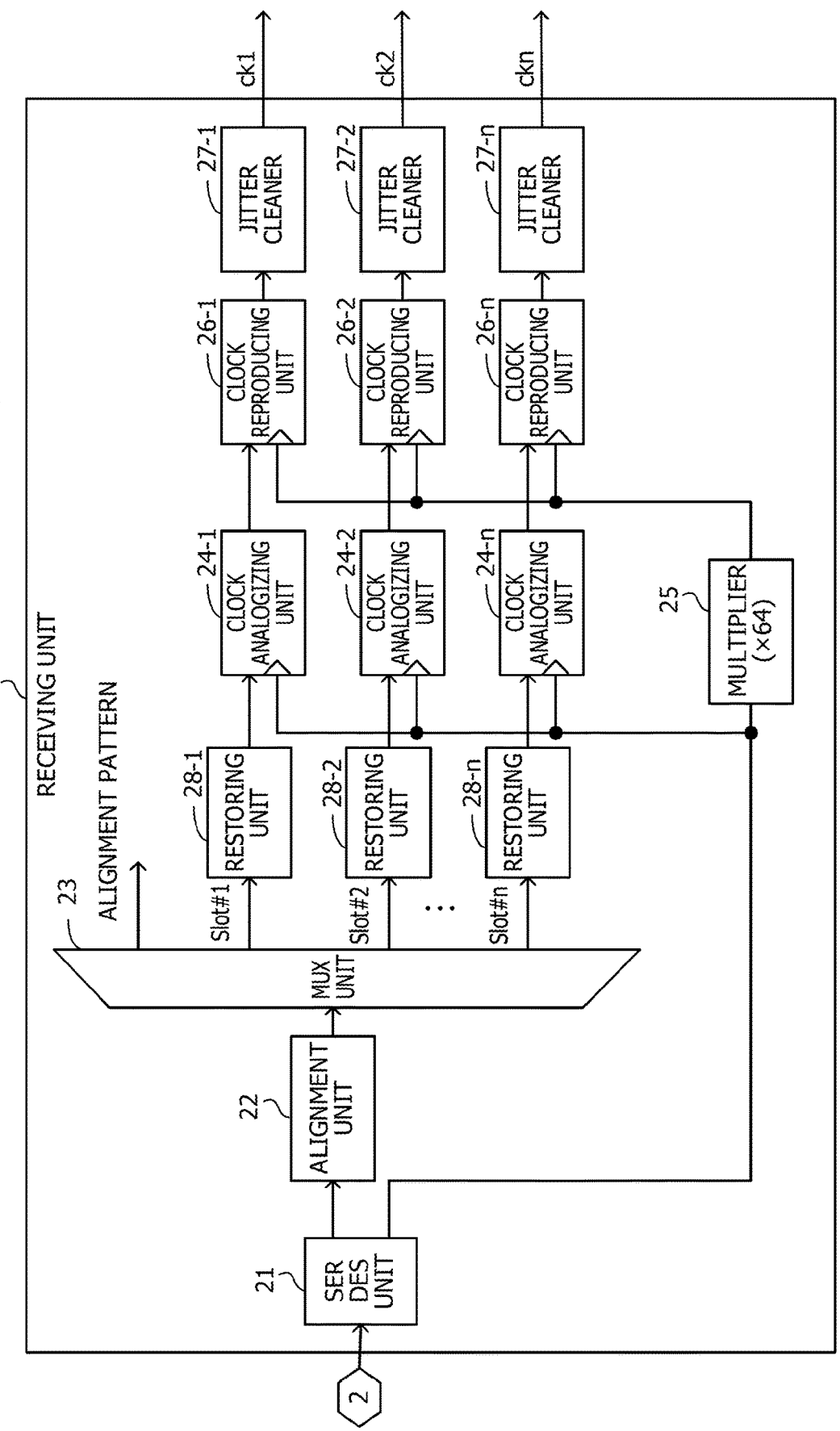
FIG. 9 depicts an example of configuration of a receiving unit of a clock transfer system.

FIGS. 8 and 9 depict an example of configuration of a clock transfer system. A clock transfer system 1-3 includes a transmitting unit 10a and a receiving unit 20a.

The transmitting unit 10a of FIG. 8 includes the sampling units 11-1, 11-2, . . . , v11-n, the alignment pattern generating unit 12, the time-division multiplexing timing generating unit 13, the MUX unit 14, the SERDES unit 15, the multiplier 16, the oscillator 17, and compressing units 18-1, 18-2, . . . , 18-n.

The compressing units 18-1, 18-2, . . . , 18-n are constituent elements added in the transmitting unit 10a. The compressing units 18-1, 18-2, . . . , 18-n are arranged between the sampling units 11-1, 11-2, . . . , 11-n and the MUX unit 14. The other components are the same as in FIG. 3.

The receiving unit 20a of FIG. 9 includes the SERDES unit 21, the alignment unit 22, the DMUX unit 23, the clock analogizing units 24-1, 24-2, . . . , 24-n, the multiplier 25, the clock reproducing units 26-1, 26-2, . . . , 26-n, the jitter cleaners 27-1, 27-2, . . . , 27-n, and restoring units 28-1, 28-2, . . . , 28-n.

The restoring units 28-1, 28-2, . . . , 28-n are constituent elements added in the receiving unit 20a. The restoring units 28-1, 28-2, . . . , 28-n are arranged between the DMUX unit 23 and the clock analogizing units 24-1, 24-2, . . . , 24-n. The other components are the same as in FIG. 4.

The compressing units 18-1, 18-2, . . . , 18-n (may be collectively referred to as compressing unit 18) compress the clock data, and the restoring units 28-1, 28-2, . . . , 28-n (may be collectively referred to as restoring unit 28) restore the compressed clock data.

<Compressed and Restored Image of Clock Data>

Figure 10:
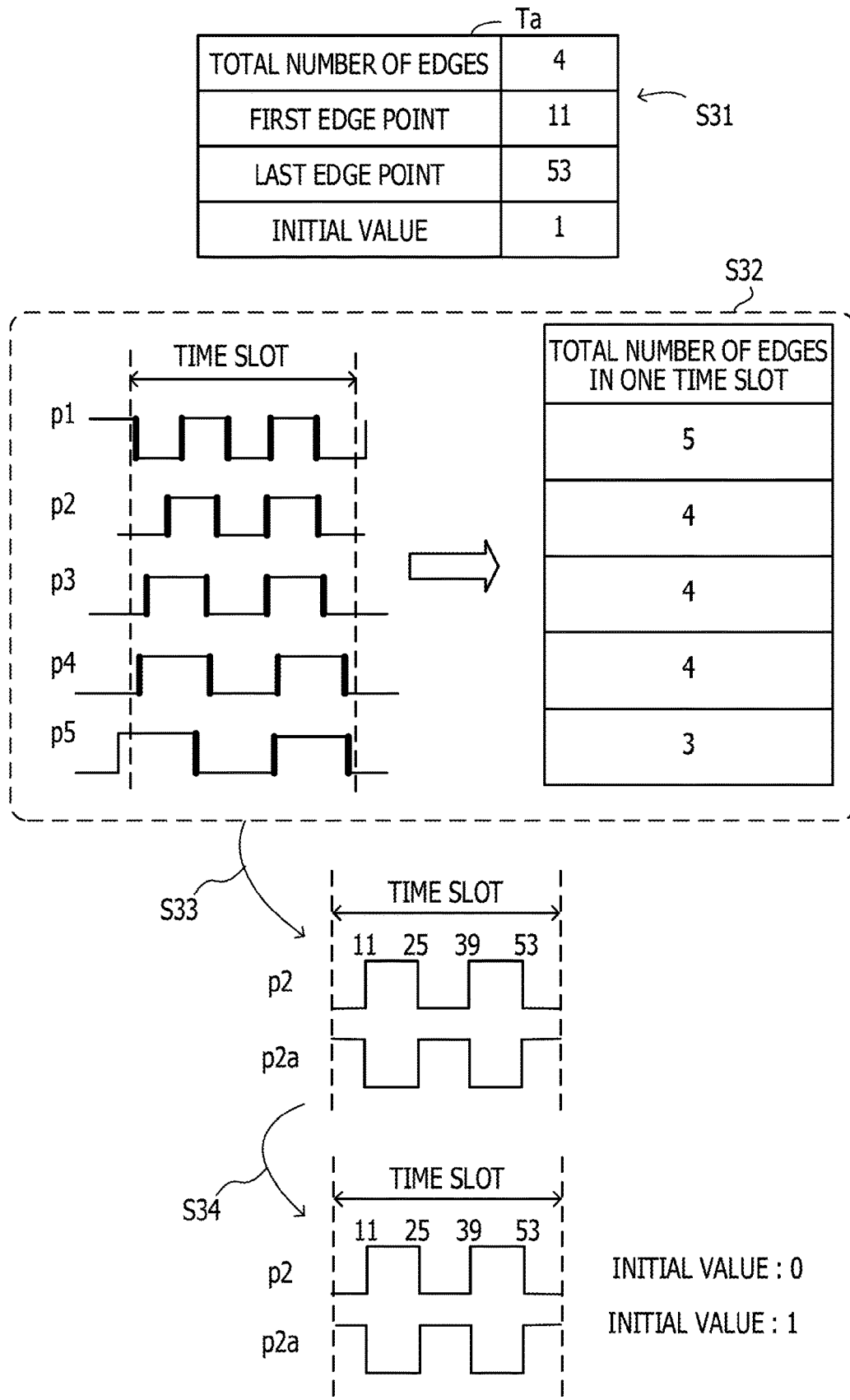
FIG. 10 depicts a compressed and restored image of clock data.

FIG. 10 depicts a compressed and restored image of clock data. The compressing unit 18 specifies a total number of edges of the clock to be superimposed, a first edge point, a last edge point, and an initial value (potential information) in one time slot.

The compressing unit 18 transmits the specified compressed information to the MUX unit 14 to compress the clock data. The restoring unit 28 restores the clock waveform based on the received compressed information.

The total number of edges is a sum of the number of rising edges and the number of falling edges in one time slot.

The first edge point indicates a position of the edge rising or falling first in one time slot. For example, when one time slot is a 64-bit cycle, the bit value at the position of the first edge among the 0 to 63 bits is the value of the first edge point.

The last edge point indicates a position of the edge rising or falling last in one time slot. For example, when one time slot is a 64-bit cycle, the bit value at the position of the last edge among the 0 to 63 bits is the value of the last edge point. The initial value indicates whether a first half period of the clock data in one time slot is 0 (L level) or 1 (H level).

[Step S31] It is assumed that the compressing unit 18 has generated compressed information as illustrated in a table Ta for the received clock data. The table Ta indicates that the total number of edges in one time slot is 4, the first edge point is 11, the last edge point is 53, and the initial value is 1.

[Step S32] Once the restoring unit 28 receives the compressed information of the table Ta, the restoring unit 28 restores the clock waveform from the compressed information. The restoring unit 28 restores the clock waveform. The restoring unit 28 first detects the clock pattern based on the total number of edges indicated in the compressed information.

For example, it is assumed that there are five clock patterns p1, . . . , p5. The total number of edges in one time slot is 5 in the clock pattern P1. The total number of edges in one time slot is 4 in the clock patterns p2, p3, and p4, and the total number of edges in one time slot is 3 in the clock pattern p5.

According to the compressed information of the table Ta, the total number of edges is 4, and the clock patterns p2, p3, and p4 of the clock patterns p1, . . . , p5 are detected.

[Step S33] The restoring unit 28 detects the clock pattern including the first/last edge points indicated in the compressed information among the clock patterns p2, p3, and p4. In the example, assuming that the first edge point of the clock pattern p2 is 11 and the last edge point is 53, the clock pattern p2 is selected.

[Step S34] The restoring unit 28 further specifies a clock pattern regarding the clock pattern p2 based on the initial value indicated in the compressed information. Although the clock pattern p2 is selected in the process so far, the total number of edges and the number of first/last edge points of an inverted phase waveform of the clock pattern p2 also satisfy the compressed information of the table Ta. Therefore, one of the non-inverted waveform and the inverted waveform is selected based on the initial value.

In the example, the initial value of the compressed information is 1. Therefore, the restoring unit 28 selects a clock pattern p2a, in which the first half period of the clock data in one time slot is 1. In this way, the restoring unit 28 specifies that the compressed clock pattern is the clock pattern p2a.

As described, an approximate period of the clock data may be calculated based on the total number of edges, and an accurate period may be calculated based on the first/last edge points. Furthermore, the phase may be calculated based on the initial value in the time slot. As a result, the receiver may restore the clock data from the compressed information.

<Compression Operation>

Figure 11:
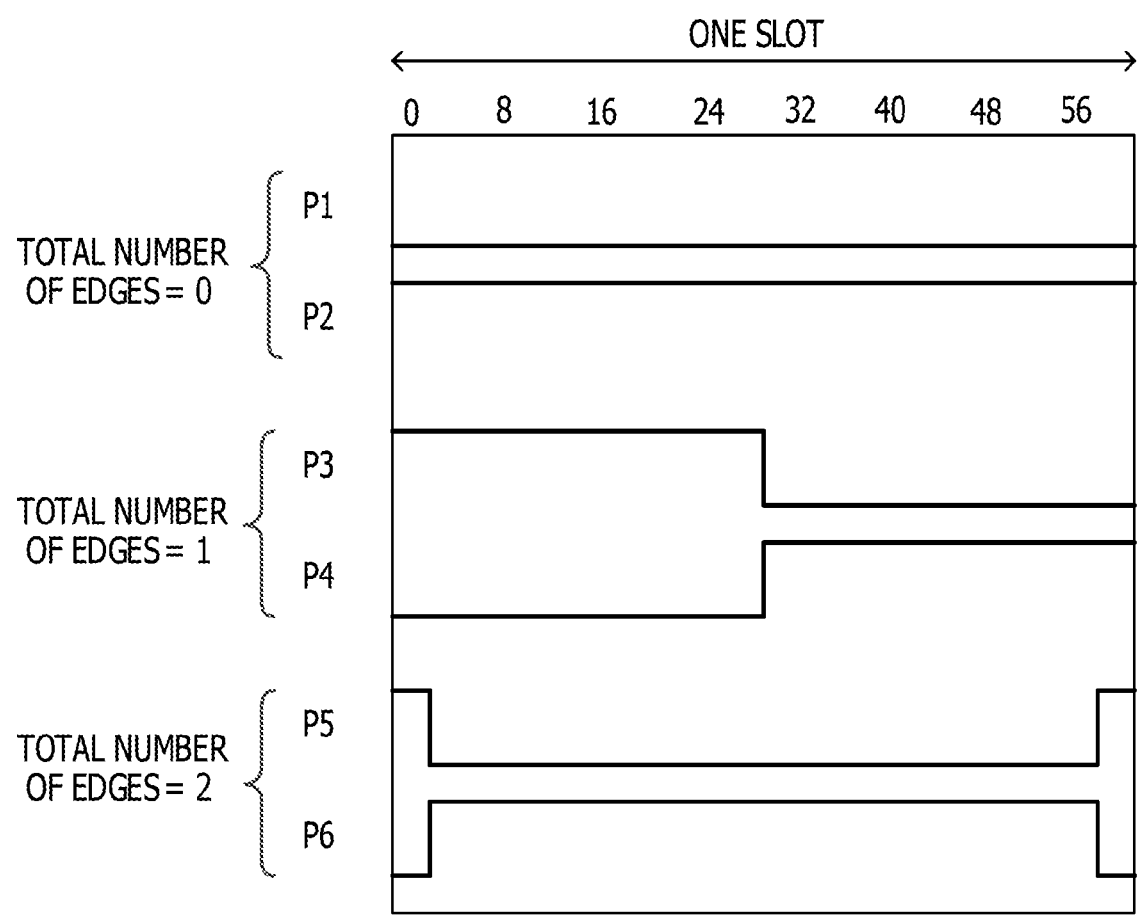
FIG. 11 depicts clock patterns in a time slot.

Next, an operation of the compressing unit 18 will be described with reference to FIGS. 11 and 12. FIG. 11 depicts clock patterns in a time slot. FIG. 11 illustrates clock patterns in which the total numbers of edges are 0, 1, and 2 in one time slot.

Clock patterns P1 and P2 are waveforms in which the total number of edges is 0, and the phases of the clock patterns P1 and P2 are inverted. Clock patterns P3 and P4 are waveforms in which the total number of edges is 1, and the phases of the clock patterns P3 and P4 are inverted. Clock patterns P5 and P6 are waveforms in which the total number of edges is 2, and the phases of the clock patterns P5 and P6 are inverted.

Note that in the clock pattern recognition, a method similar to the method in the case of two edges may be used to recognize the clock patterns for the case of three or more edges, and therefore, the waveforms with three or more edges are not described.

Figure 12:
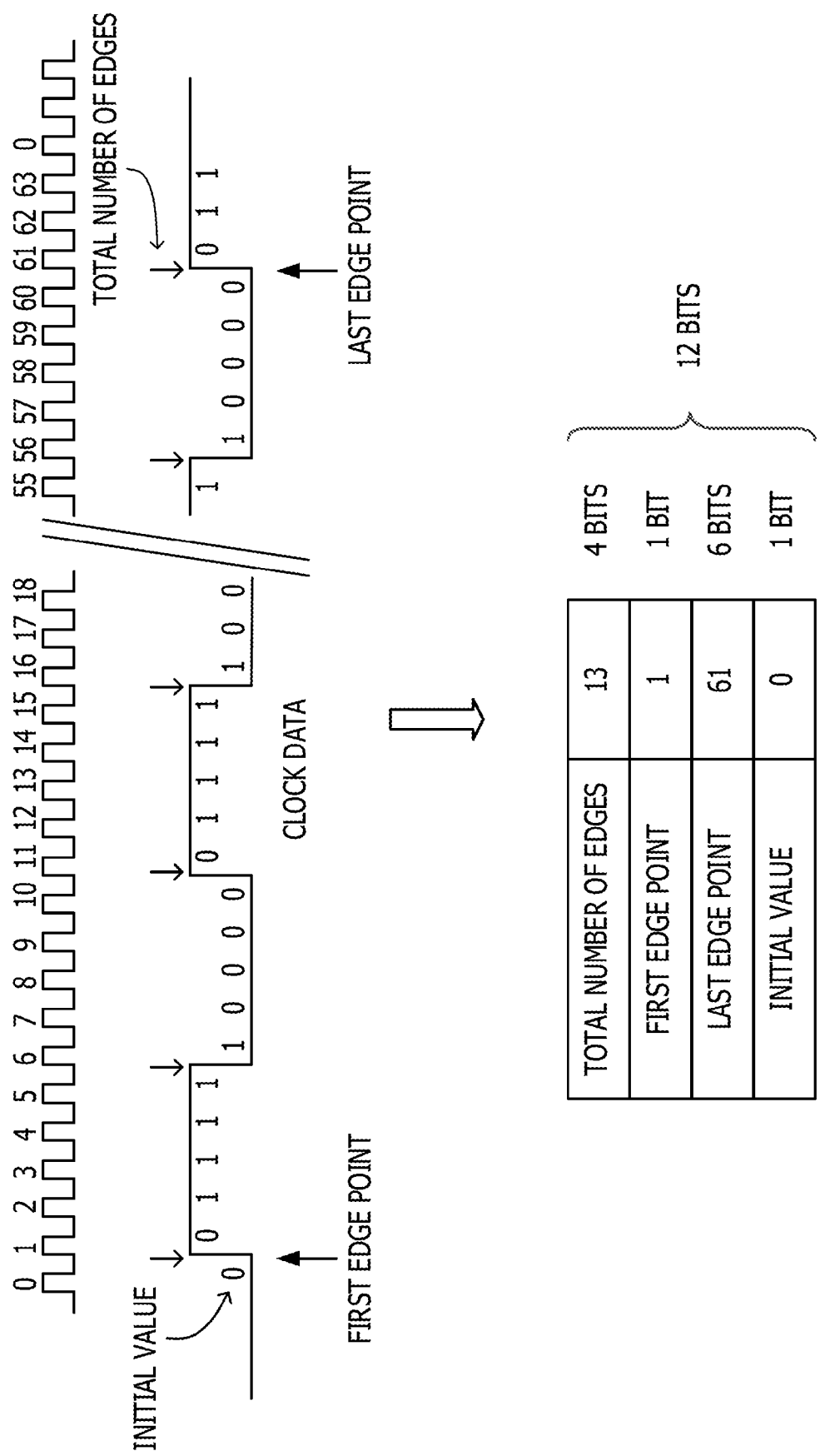
FIG. 12 depicts an example of a compression operation.

FIG. 12 depicts an example of a compression operation. FIG. 12 illustrates a compression process in which the superimposed data is 64 bits. In one time slot (64-bit cycle from 0 to 63) of the clock data illustrated in FIG. 12, the sum of the number of rising edges and the number of falling edges is 13. Therefore, the total number of edges is 13, and the total number of edges may be expressed in 4 bits in this case.

The first edge point is 1, and the first edge point may be expressed in 1 bit in this case. The last edge point is 61, and the last edge point may be expressed in 6 bits in this case. The initial value is 0, and the initial value may be expressed in 1 bit. Therefore, the compressed information is 12 bits in total. Therefore, the data may be compressed from 64 bits to 12 bits in the example.

Note that the total number of edges may be expressed in 6 bits at most in the time slot of the 64-bit cycle. The sum of the value of the first edge point and the value of the last edge point may be expressed in 11 bits at most (11 bits are used for $_{63}C_2=1953$ kinds). The initial value may be expressed in 1 bit.

Therefore, the clock data transmitted by the SERDES may be compressed from 64 bits to 18 bits or less, and the SERDES transfer may be slowed down.

<Compression Operation (Another Pattern)>

Figure 13:
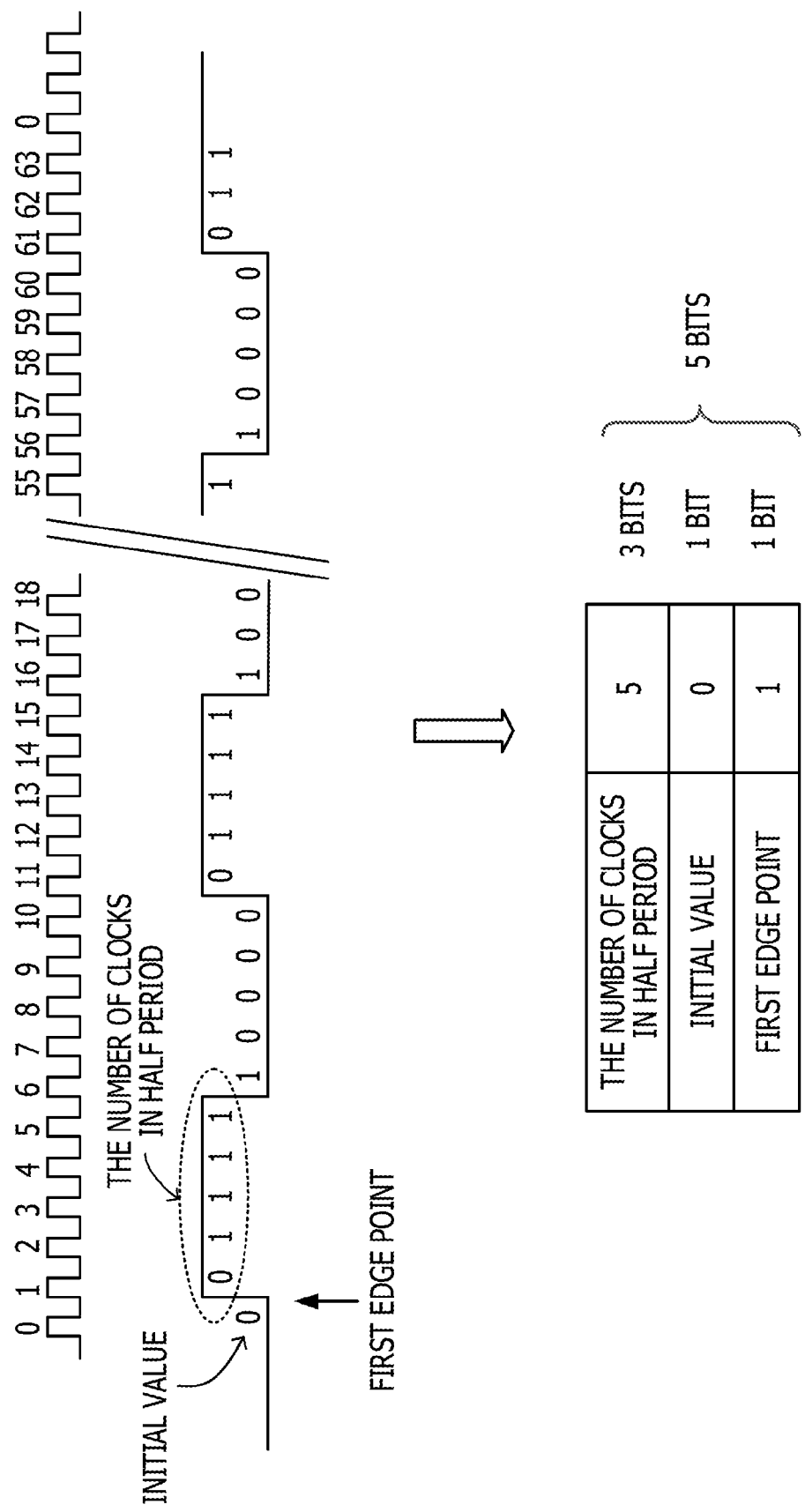
FIG. 13 depicts an example of a compression operation.

FIG. 13 depicts an example of a compression operation. FIG. 13 illustrates an example of the compression operation of a pattern different from the pattern described above. In this case, the frequency includes two or more edges in one time slot, and the compression operation is based on the premise that there is no disturbance in a first period in one time slot. In this case, the compressed information includes the number of clocks in a half period, the initial value, and the first edge point.

The number of clocks in the half period is the number of reference clocks included in the half period of the clock signal to be compressed. The number of clocks is five in the example, and this may be expressed in three bits. The initial value and the first edge point are the same as in the case described above. In the example, the initial value is 0, and the first edge point is 1. Each of the initial value and the first edge point may be expressed in 1 bit. Therefore, the data may be compressed from 64 bits to 5 bits in the example.

Note that in the time slot of 64-bit cycle, the number of clocks in the half period may be expressed in 6 bits at most. The initial value may be expressed in 1 bit, and the first edge point may be expressed in 5 bits at most. Therefore, the data may be compressed from 64 bits to 12 bits or less.

<Operation of Restoring Unit>

Figure 14:
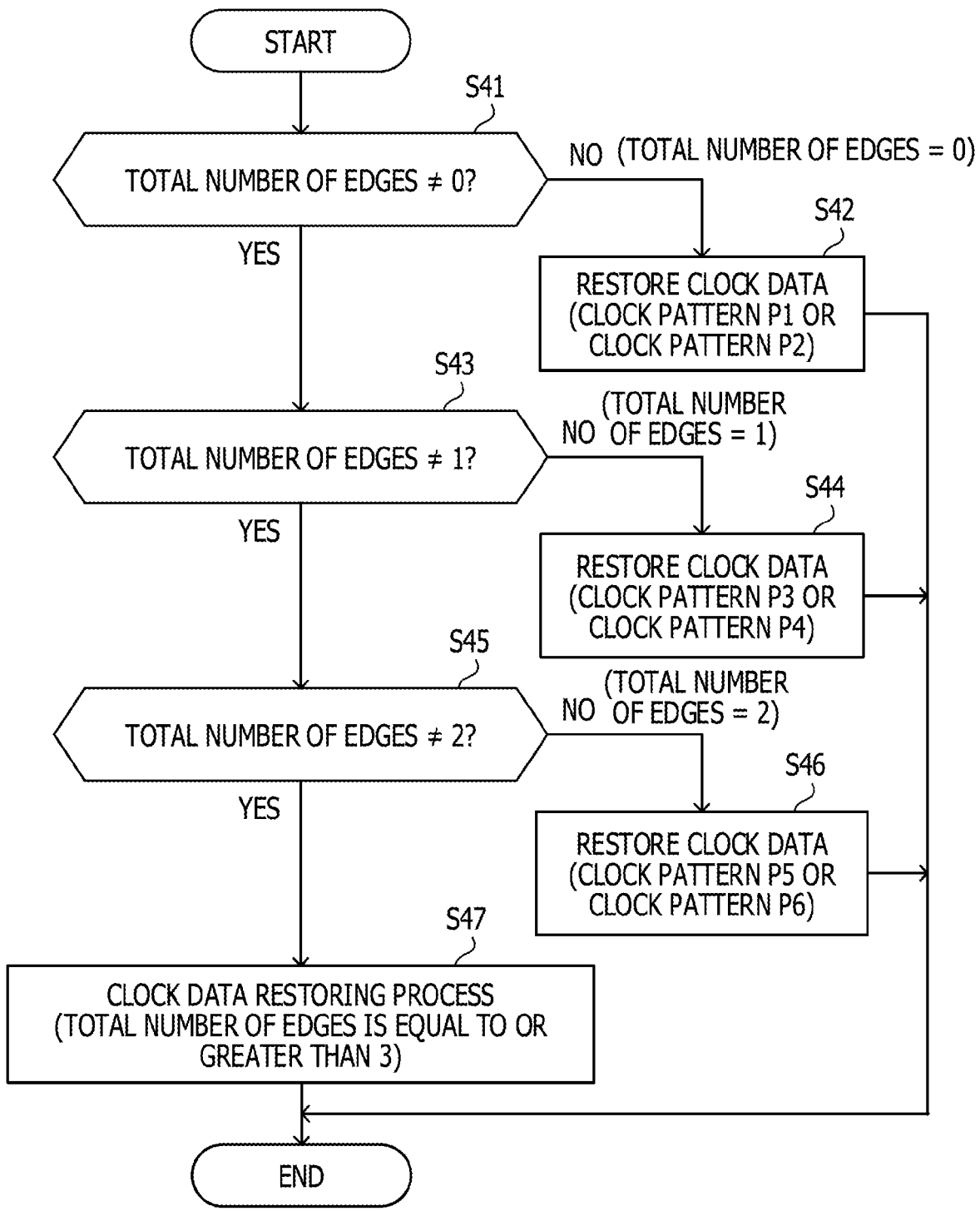
FIG. 14 is a flow chart illustrating an operation of a restoring unit.

FIG. 14 is a flow chart illustrating an operation of a restoring unit. FIG. 14 illustrates an operation flow when the restoring unit 28 restores the clock based on the compressed information.

[Step S41] The restoring unit 28 determines whether or not the total number of edges in one time slot is 0. The process proceeds to step S42 when the total number of edges is 0, and the process proceeds to step S43 when the total number of edges is not 0.

[Step S42] The restoring unit 28 restores the clock pattern P1 or the clock pattern P2 illustrated in FIG. 11 based on the initial value.

[Step S43] The restoring unit 28 determines whether or not the total number of edges in one time slot is 1. The process proceeds to step S44 when the total number of edges is 1, and the process proceeds to step S45 when the total number of edges is not 1.

[Step S44] The restoring unit 28 restores the clock pattern P3 or the clock pattern P4 illustrated in FIG. 11 based on the initial value.

[Step S45] The restoring unit 28 determines whether or not the total number of edges in one time slot is 2. The process proceeds to step S46 when the total number of edges is 2, and the process proceeds to step S47 when the total number of edges is not 2.

[Step S46] The restoring unit 28 restores the clock pattern P5 or the clock pattern P6 illustrated in FIG. 11 based on the initial value.

[Step S47] The restoring unit 28 executes a clock data restoring process described later in FIG. 15 when the total number of edges is equal to or greater than 3.

Figure 15:
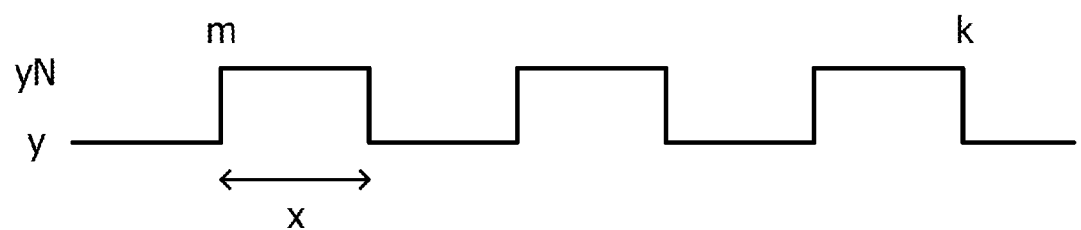
FIG. 15 is a diagram for describing an example of a clock data restoring process.

FIG. 15 is a diagram for describing an example of a clock data restoring process. In the example, y represents the initial value of the clock signal (yN represents the inverted value), n represents the total number of edges, m represents the first edge point, and k represents the last edge point.

In this case, one time slot includes (n/2−0.5) to (n/2+0.5) periods. In addition, (k−m) includes (n/2−0.5) periods, and assuming that the half period includes x clocks, x may be expressed by Equation (1).

$$x = (k-m)/(n/2-0.5) \quad (1)$$

Therefore, the section from the first clock to m is y, and the section of x clocks from m is yN. The waveform may be restored by repeating y, . . . , after the x clocks.

<Error Correction>

Next, an error correction process will be descried. The error tolerance of the clock data may be improved by combining the error detection and correction functions.

Figure 16:
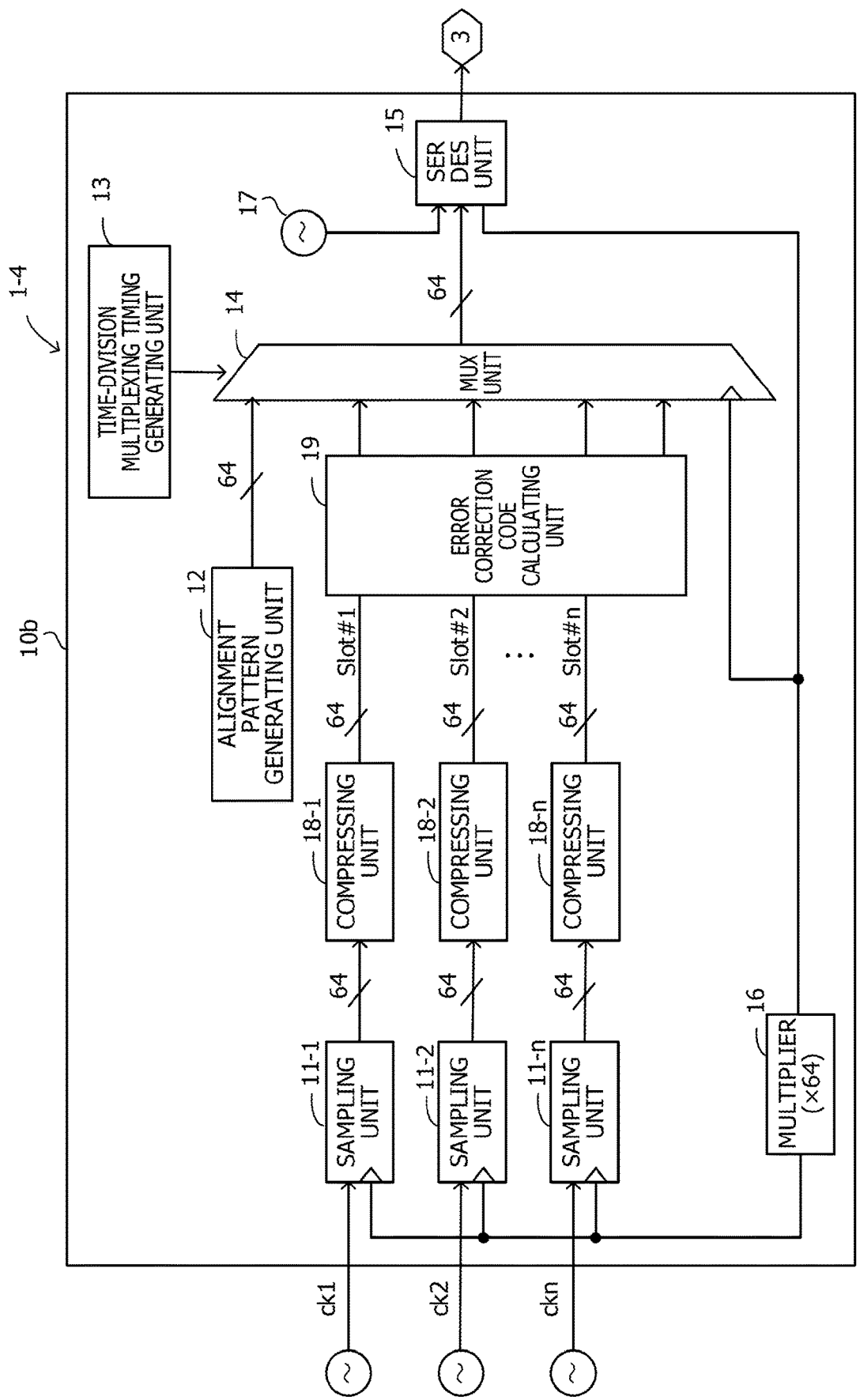
FIG. 16 depicts an example of configuration of a transmitting unit of a clock transfer system.
Figure 17:
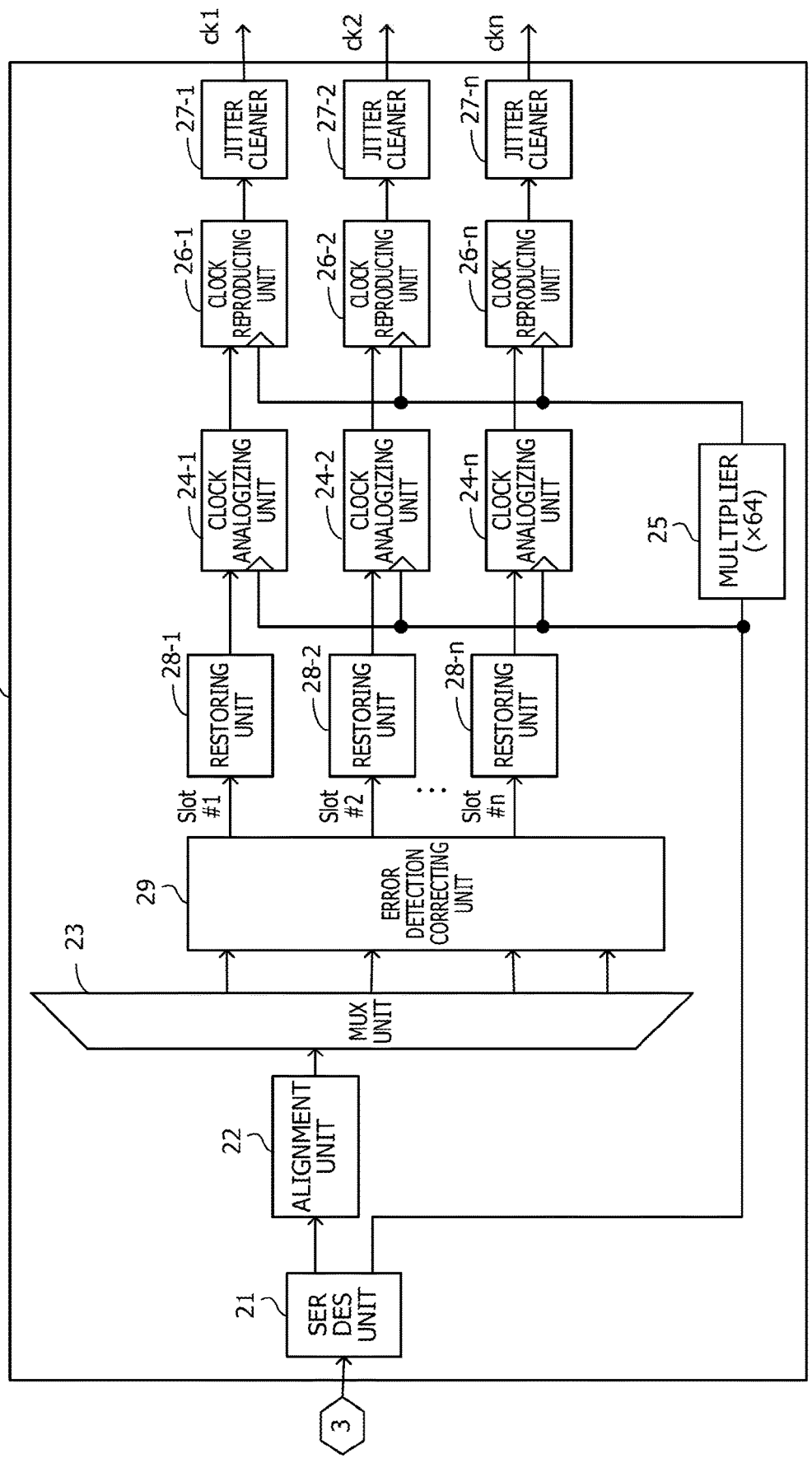
FIG. 17 depicts an example of configuration of a receiving unit of a clock transfer system.

FIGS. 16 and 17 depict an example of configuration of a clock transfer system. A clock transfer system 1-4 includes a transmitting unit 10b and a receiving unit 20b.

The transmitting unit 10b of FIG. 16 includes the sampling units 11-1, 11-2, . . . , 11-n, the alignment pattern generating unit 12, the time-division multiplexing timing generating unit 13, the MUX unit 14, the SERDES unit 15, the multiplier 16, the oscillator 17, the compressing units 18-1, 18-2, . . . , 18-n, and an error correction code calculating unit 19.

The error correction code calculating unit 19 is a constituent element added in the transmitting unit 10b. The error correction code calculating unit 19 is arranged between the compressing units 18-1, 18-2, . . . , 18-n and the MUX unit 14. The other components are the same as in FIG. 8.

The error correction code calculating unit 19 applies an operation to the compressed data for each clock type to calculate an error correction code (ECC) and transmits the data provided with the correction code to the MUX unit 14.

The receiving unit 20b of FIG. 17 includes the SERDES unit 21, the alignment unit 22, the DMUX unit 23, the clock analogizing units 24-1, 24-2, . . . , 24-n, the multiplier 25, the clock reproducing units 26-1, 26-2, . . . , 26-n, the jitter cleaners 27-1, 27-2, . . . , 27-n, restoring units 28-1, 28-2, . . . , 28-n, and an error detection correcting unit 29.

The error detection correcting unit 29 is a constituent element added in the receiving unit 20b. The error detection correcting unit 29 is arranged between the DMUX unit 23 and the restoring units 28-1, 28-2, . . . , 28-n. The other components are the same as in FIG. 9.

The error detection correcting unit 29 receives the superimposed data of each slot and the separated error correction code from the DMUX unit 23 and performs calculation to check whether there is an error in the superimposed data. When an error is detected, the error detection correcting unit 29 corrects the error based on the code.

<Frame Format Provided with Error Correction Codes>

Figure 18:
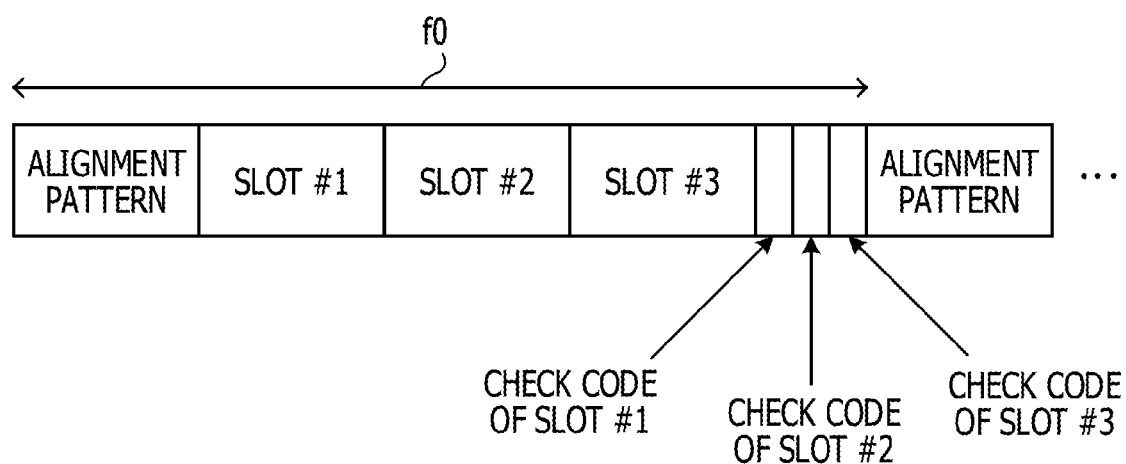
FIG. 18 depicts an example of a frame format provided with error correction codes.

FIG. 18 depicts an example of a frame format provided with error correction codes. FIG. 18 illustrates an example of a frame with three time slots.

A frame f0 includes fields of an alignment pattern, clock data of slot #1, clock data of slot #2, clock data of slot #3, a check code (error correction code) of slot #1, a check code of slot #2, and a check code of slot #3 (for example, the check code is 8 bits).

When 1 time slot includes 64 clocks, a check code of 8 bits is provided to 64-bit data. Therefore, multiplexing is performed by allocating 1 time slot to the check code for every 8 time slots. When the compression is carried out, the error correction code is provided to the compressed data.

<Process when Error Correction is not Possible>

Figure 19:
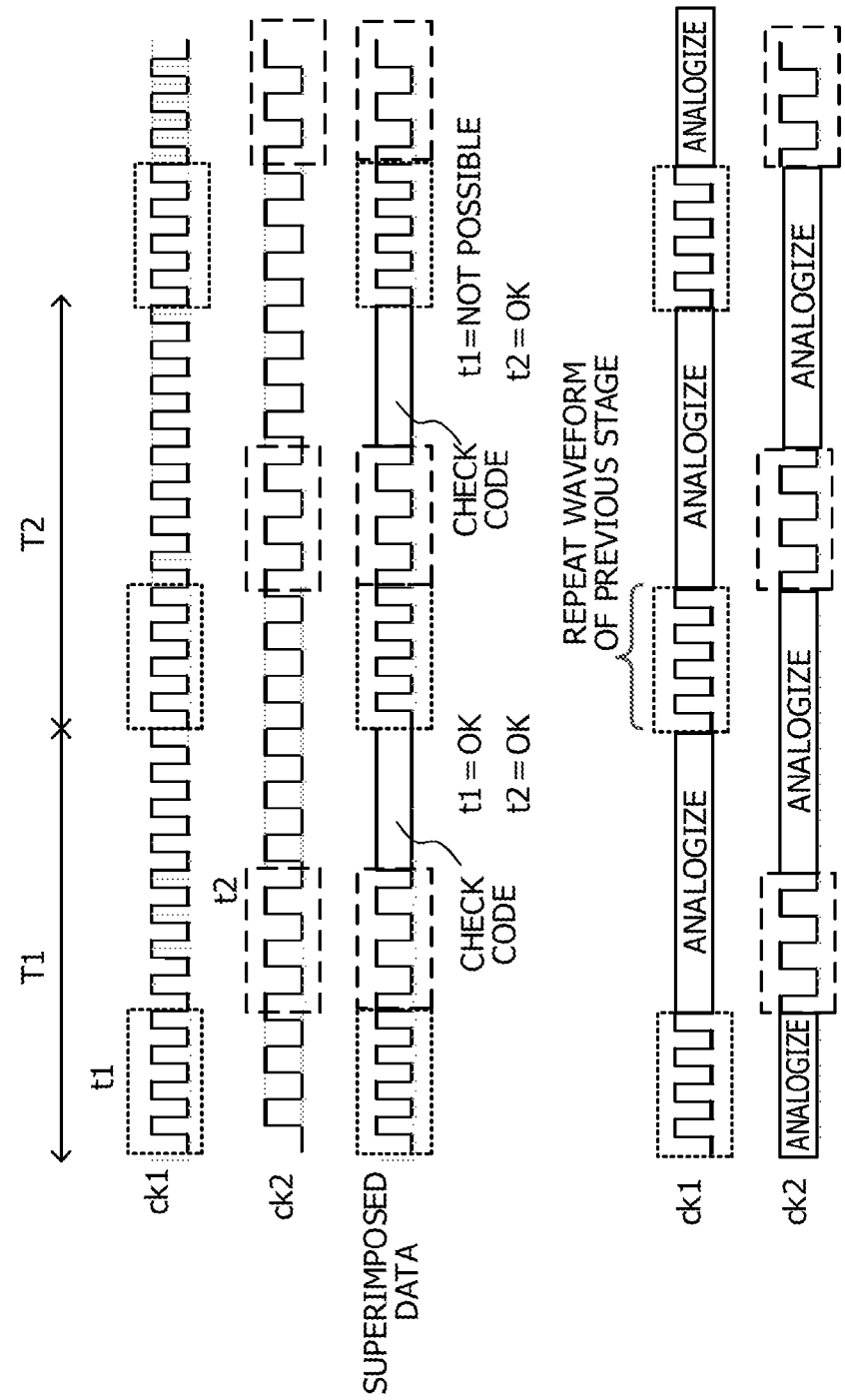
FIG. 19 depicts an example of a process when error correction is not possible.

FIG. 19 depicts an example of a process when error correction is not possible. The superimposed data is generated by repeating a section t1 of the clock signal ck1, a section t2 of the clock signal ck2, and the error correction code.

In a cycle T1, the error detection correcting unit 29 corrects the errors of the clock signals ck1 and ck2 based on the error correction code, and the clock analogizing unit 24 analogizes the clock signals ck1 and ck2.

In a cycle T2, it is assumed that the error correction of the clock signal ck1 is not possible, and the error correction of the clock signal ck2 is possible based on the error correction code in the error detection correcting unit 29. In this case, the clock analogizing unit repeats the waveform of the clock signal ck1 of the previous stage for the clock signal ck1 in which the error correction is not possible. The clock analogizing unit regards the waveform repeating section as an analogizing section and extends the analogizing section.

<Clock Transfer Using Computer Program>

Figure 20:
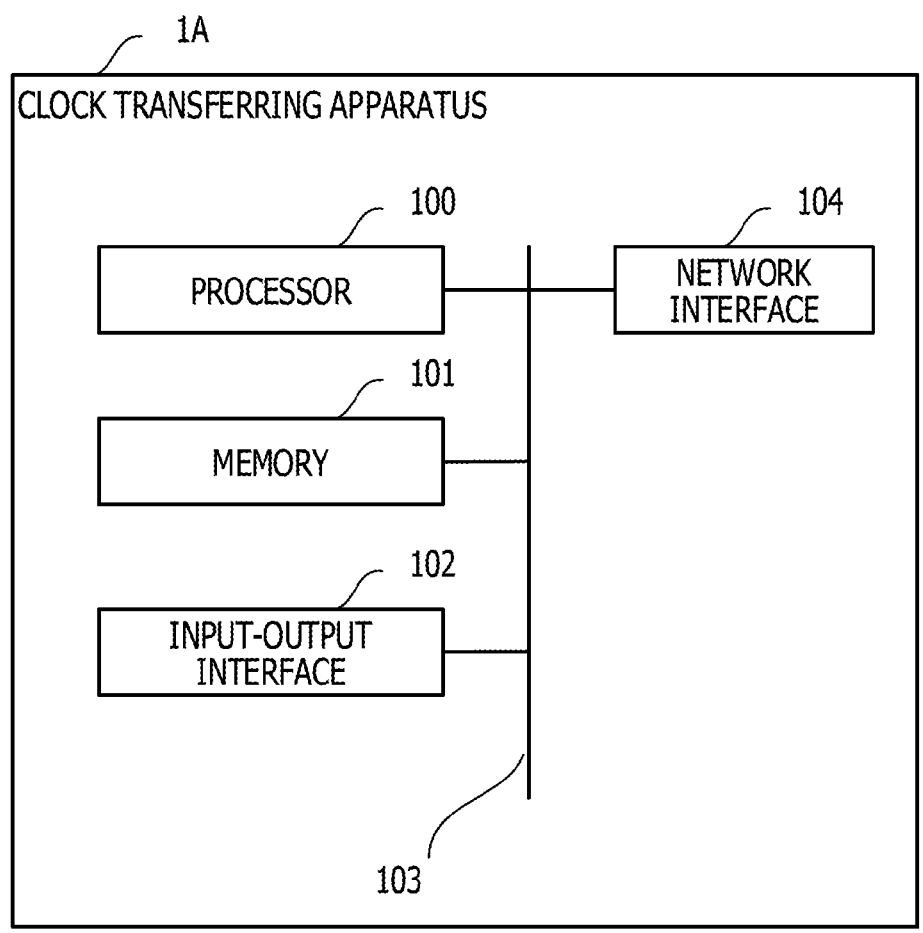
FIG. 20 depicts an example of computer hardware configuration of a clock transferring apparatus.

FIG. 20 depicts an example of a computer hardware configuration of a clock transferring apparatus. FIG. 20 illustrates a configuration example in which a computer is used to control the clock transfer. A clock transferring apparatus 1A has both of functions of a transmitter and functions of a receiver, and a processor 100 controls the entire apparatus. For example, the processor 100 functions as a controlling unit of the transmitter and the receiver of the clock transferring apparatus 1A.

A memory 101 and a plurality of peripheral devices are coupled to the processor 100 through a bus 103. The processor 100 may be a multiprocessor. The processor 100 is, for example, a central processing unit (CPU), a micro processing unit (MPU), a digital signal processor (DSP), an ASIC, or a programmable logic device (PLD). The processor 100 may also be a combination of two or more of the CPU, the MPU, the DSP, the ASIC, and the PLD.

The memory 101 is used as a main storage apparatus of the clock transferring apparatus 1A. At least part of a program of an operating system (OS) or an application program to be executed by the processor 100 is temporarily stored in the memory 101. Various types of data for processing by the processor 100 are also stored in the memory 101.

The memory 101 is also used as an auxiliary storage apparatus of the clock transferring apparatus 1A, and a program of an OS, an application program, and various types of data are stored in the memory 101. The memory 101 may include a semiconductor storage apparatus, such as a flash memory and a solid state drive (SSD), or a magnetic recording medium, such as a hard disk drive (HDD), as an auxiliary storage apparatus.

Examples of the peripheral devices coupled to the bus 103 include an input-output interface 102 and a network interface 104. A monitor (for example, light emitting diode (LED)) or liquid crystal display (LCD) that functions as a display apparatus for displaying the state of the clock transferring apparatus 1A according to a command from the processor 100 is coupled to the input-output interface 102.

An information input apparatus, such as a keyboard and a mouse, may be coupled to the input-output interface 102, and the input-output interface 102 transmits a signal sent from the information input apparatus to the processor 100.

The input-output interface 102 also functions as a communication interface for coupling a peripheral device. For example, an optical drive apparatus that uses laser light or the like to read data recorded in an optical disk may be coupled to the input-output interface 102. Examples of the optical disk include Blu-ray Disc (registered trademark), a compact disc read only memory (CD-ROM), and a CD-recordable (R)/rewritable (RW).

A memory apparatus or a memory reader/writer may also be coupled to the input-output interface 102. The memory apparatus is a recording medium having a function of communicating with the input-output interface 102. The memory reader/writer is an apparatus that writes data to a memory card or reads data from the memory card. The memory card is a card-type recording medium.

The network interface 104 controls the interface for the network, and, for example, a network interface card (NIC), a wireless local area network (LAN) card, or the like may be used. The data received by the network interface 104 is output to the memory 101 or the processor 100.

The hardware configuration may realize the processing function of the clock transferring apparatus 1A. For example, the processor 100 may execute given programs to allow the clock transferring apparatus 1A to perform the control according to the present invention.

The clock transferring apparatus 1A executes programs recorded in, for example, a computer-readable recording medium to realize the processing functions of the present invention. The programs describing the processes to be executed by the clock transferring apparatus 1A may be recorded in various recording media.

For example, the programs to be executed by the clock transferring apparatus 1A may be stored in the auxiliary storage apparatus. The processor 100 loads at least part of the programs in the auxiliary storage apparatus to the main storage apparatus to execute the programs.

The programs may also be recorded in a portable recording medium, such as an optical disk, a memory apparatus, and a memory card. The programs stored in the portable recording medium may be executed after installing the programs on the auxiliary storage apparatus based on the control by the processor 100, for example. The processor 100 may also directly read the programs from the portable recording medium to execute the programs.

A computer may realize the processing functions of the clock transferring apparatus 1A of the present invention described above. In this case, a program describing the process of the function to be included in the clock transferring apparatus 1A is provided. The computer executes the program, and the processing function is realized on the computer.

The program describing the process may be recorded in a computer-readable recording medium. Examples of the computer-readable recording medium include a magnetic storage apparatus, an optical disk, a magneto-optical recording medium, and a semiconductor memory. Examples of the magnetic storage apparatus include a hard disk drive (HDD), a flexible disk (FD), and a magnetic tape. An example of the optical disk includes a CD-ROM/RW. An example of the magneto-optical recording medium includes a magneto optical disk (MO).

To distribute a program, a portable recording medium, such as a CD-ROM recording the program, is sold. The program may also be stored in the storage apparatus of a server computer, and the program may be transferred from the server computer to another computer through the network.

The computer that executes the program stores, in the storage apparatus of the computer, the program recorded in the portable recording medium or the program transferred from the server computer, for example. The computer reads the program from the storage apparatus of the computer and executes the process according to the program. The computer may also directly read the program from the portable recording medium to execute the process according to the program.

The computer may also execute processes according to received programs one after another every time the program is transferred from the server computer coupled through the network. At least part of the processing functions may also be realized by an electronic circuit, such as DSP, ASIC, and PLD.

Although the embodiments have been described, the configuration of each component illustrated in the embodiments may be replaced with a configuration with a similar function. Other arbitrary components or processes may also be added. Furthermore, two or more arbitrary configurations (features) in the embodiments may also be combined.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A transmitter comprising:
a memory; and
a processor coupled to the memory and the processor configured to
generate a first clock parallel signal by performing serial-parallel conversion of a first clock signal that has been sampled by using a reference clock and generate a second clock parallel signal by performing serial-parallel conversion of a second clock signal that has been sampled by using the reference clock,
generate first compressed information by compressing the first clock parallel signal on the basis of clock periodicity and generate second compressed information by compressing the second clock parallel signal based on the clock periodicity,
generate a serial signal by adding a synchronization signal indicating a top of a multiplexed signal to the multiplexed signal generated by time-division multiplexing of the first compressed information and the second compressed information, and
transmit the serial signal to a receiver, wherein
the first compressed information includes a total number of edges that is a sum of a number of rising edges and a number of falling edges in a first time slot of the first clock signal, a first edge point indicating a position of an edge rising or falling first in the first time slot, a last edge point indicating a position of an edge rising or falling last in the first time slot, and potential information indicating whether a potential of a start signal level of the first time slot is low or high, and
the second compressed information includes a total number of edges that is a sum of a number of rising edges and a number of falling edges in a second time slot of the second clock signal, a first edge point indicating a position of an edge rising or falling first in the second time slot, a last edge point indicating a position of an edge rising or falling last in the second time slot, and potential information indicating whether a potential of a start signal level of the second time slot is low or high.

2. The transmitter according to claim 1, wherein
the processor is further configured to calculate a first error correction code based on the first compressed information and calculate a second error correction code based on the second compressed information, and
the serial signal is generated by the time-division multiplexing of the first compressed information, the second compressed information, the synchronization signal, the first error correction code, and the second error correction code.

3. A receiver comprising:
a memory; and
a processor coupled to the memory and the processor configured to
generate a parallel signal by performing serial-parallel conversion of a serial signal received from a transmitter, the serial signal being generated by adding a synchronization signal to a multiplexed signal, the synchronization signal indicating a top of the multiplexed signal, the multiplexed signal being generated by time-division multiplexing of first compressed information and second compressed information, the first compressed information being generated by compressing a first clock parallel signal obtained by serial-parallel conversion of a first clock signal acquired by using a reference clock, the second compressed information being generated by compressing a second clock parallel signal obtained by serial-parallel conversion of a second clock signal acquired by using the reference clock,
control synchronization of the parallel signal on the basis of the synchronization signal,
perform separation of the first compressed information, the second compressed information, and the synchronization signal from the parallel signal,
generate first clock waveform data by restoring a clock waveform of the first clock parallel signal in accordance with the first compressed information and generate second clock waveform data by restoring a clock waveform of the second clock parallel signal in accordance with the second compressed information,
generate a first clock parallel complement signal by complementing the waveform of the first clock waveform data and generate a second clock parallel complement signal by complementing the waveform of the second clock waveform data, and
reproduce the first clock signal by performing parallel-serial conversion of the first clock parallel complement signal and reproduce the second clock signal by performing parallel-serial conversion of the second clock parallel complement signal.

4. The receiver according to claim 3, wherein
the first compressed information includes a total number of edges that is a sum of a number of rising edges and a number of falling edges in a first time slot of the first clock signal, a first edge point indicating a position of an edge rising or falling first in the first time slot, a last edge point indicating a position of an edge rising or falling last in the first time slot, and potential information indicating whether a potential of a start signal level of the first time slot is low or high,
the second compressed information includes a total number of edges that is a sum of a number of rising edges and a number of falling edges in a second time slot of the second clock signal, a first edge point indicating a position of an edge rising or falling first in the second time slot, a last edge point indicating a position of an edge rising or falling last in the second time slot, and potential information indicating whether a potential of a start signal level of the second time slot is low or high, and
the processor is configured to
detect a period of the first time slot on the basis of the total number of edges, the first end point, and the last edge point in the first compressed information, and detect a phase of the first time slot on the basis of the potential information in the first compressed information, and detect a period of the second time slot on the basis of the total number of edges, the first edge point, and the last edge point in the second compressed information, and detect a phase of the second time slot on the basis of on the potential information in the second compressed information.

5. The receiver according to claim 3, wherein when a first error correction code generated based on the first compressed information and a second error correction code generated based on the second compressed information are multiplexed with the serial signal, the separation includes separating the first compressed information, the second compressed information, the synchronization signal, the first error correction code, and the second error correction code, and the processor is configured to detect and correct an error of the first compressed information in accordance with the first error correction code and detect and correct an error of the second compressed information in accordance with the second error correction code.

6. A computer-implemented clock transfer method comprising:

generating a first clock parallel signal by performing serial-parallel conversion of a first clock signal that has been sampled by using a reference clock and generate a second clock parallel signal by performing serial-parallel conversion of a second clock signal that has been sampled by using the reference clock;

generating first compressed information by compressing the first clock parallel signal on the basis of clock periodicity and generate second compressed information by compressing the second clock parallel signal based on the clock periodicity;

generating a serial signal by adding a synchronization signal indicating a top of a multiplexed signal to the multiplexed signal generated by time-division multiplexing of the first compressed information and the second compressed information; and transmitting the serial signal to a receiver, wherein the first compressed information includes a total number of edges that is a sum of a number of rising edges and a number of falling edges in a first time slot of the first clock signal, a first edge point indicating a position of an edge rising or falling first in the first time slot, a last edge point indicating a position of an edge rising or falling last in the first time slot, and potential information indicating whether a potential of a start signal level of the first time slot is low or high, and the second compressed information includes a total number of edges that is a sum of a number of rising edges and a number of falling edges in a second time slot of the second clock signal, a first edge point indicating a position of an edge rising or falling first in the second time slot, a last edge point indicating a position of an edge rising or falling last in the second time slot, and potential information indicating whether a potential of a start signal level of the second time slot is low or high.

7. The clock transfer method according to claim 6, wherein the processor is further configured to calculate a first error correction code based on the first compressed information and calculate a second error correction code based on the second compressed information, and the serial signal is generated by the time-division multiplexing of the first compressed information, the second compressed information, the synchronization signal, the first error correction code, and the second error correction code.

\* \* \* \* \*